United States Patent
Rosenfeld et al.

(10) Patent No.: US 10,209,556 B2
(45) Date of Patent: Feb. 19, 2019

(54) METHOD, APPARATUS AND SYSTEM FOR FORMING FILTER ELEMENTS ON DISPLAY SUBSTRATES

(75) Inventors: Gil Rosenfeld, North Vancouver (CA); Eran Elizur, Vancouver (CA); Gregory Dean Peregrym, Port Moody (CA); David Victor Marcolin, Burnaby (CA); Guy Sirton, Delta (CA)

(73) Assignee: E Ink Corporation, Billerica, MA (US)

( * ) Notice: Subject to any disclaimer, the term of this patent is extended or adjusted under 35 U.S.C. 154(b) by 467 days.

(21) Appl. No.: 13/810,355

(22) PCT Filed: Jul. 21, 2011

(86) PCT No.: PCT/CA2011/000852
§ 371 (c)(1),
(2), (4) Date: Nov. 14, 2014

(87) PCT Pub. No.: WO2012/012875
PCT Pub. Date: Feb. 2, 2012

(65) Prior Publication Data
US 2015/0124345 A1    May 7, 2015

Related U.S. Application Data

(60) Provisional application No. 61/520,138, filed on Jun. 6, 2011, provisional application No. 61/402,234, filed
(Continued)

(51) Int. Cl.
*G02F 1/1335* (2006.01)
*G02B 5/22* (2006.01)
(Continued)

(52) U.S. Cl.
CPC ....... *G02F 1/133516* (2013.01); *G02B 5/201* (2013.01); *G02B 5/22* (2013.01);
(Continued)

(58) Field of Classification Search
CPC ........ F21S 10/00; F21S 10/02; G02B 26/007; G02B 5/22; G02B 5/201; G02F 1/1303;
(Continued)

(56) References Cited

U.S. PATENT DOCUMENTS

| 6,025,860 A | 2/2000 | Rosenfeld et al. |
| 6,147,728 A | 11/2000 | Okumura et al. |

(Continued)

FOREIGN PATENT DOCUMENTS

| JP | 2005049897 | 2/2005 |
| JP | 2009003460 | 1/2009 |

(Continued)

OTHER PUBLICATIONS

Canadian Intellectual Property Office; PCT/CA2011/000852; International Search Report and Written Opinion; dated Nov. 25, 2011. Nov. 15, 2011.

*Primary Examiner* — Kristina M Deherrera
(74) *Attorney, Agent, or Firm* — Antranig Baronian

(57) ABSTRACT

A method and system for forming filter elements on a plurality of display substrates using a digital imaging system operable to selectively deposit filter material at a plurality of deposition locations is disclosed. The method involves receiving orientation information defining a disposition of a plurality of pixels associated with the at least one display substrate, identifying pixels in the plurality of pixels that are to receive filter material for forming a filter element on the pixel, selecting deposition locations within each of the identified pixels in accordance with the orientation information to meet an alignment criterion associated with placement of the filter element within the pixel, and controlling the digital imaging system to cause deposition of the filter material at the selected deposition locations. A method and system for forming filter elements on a substrate is also disclosed, which involves selecting locations to receive filter
(Continued)

material for forming filter elements on the substrate, introducing a random variation in placement of the filter elements, and forming filter elements at the selected locations, the substrate being subsequently aligned to a display substrate for forming a display. A method and system for forming filter elements on a display substrate is also disclosed, which involves selectively depositing filter material to form the filter elements on a plurality of pixels associated with the display substrate, and selectively exposing the deposited filter material to thermal laser radiation to condition the deposited filter material.

7 Claims, 11 Drawing Sheets

Related U.S. Application Data on Aug. 26, 2010, provisional application No. 61/400,291, filed on Jul. 26, 2010.

(51) Int. Cl.
  *G02F 1/13* (2006.01)
  *G02B 5/20* (2006.01)
  *H01L 27/32* (2006.01)
  *H01L 51/56* (2006.01)

(52) U.S. Cl.
  CPC .......... *G02F 1/1303* (2013.01); *H01L 27/322* (2013.01); *H01L 51/56* (2013.01)

(58) Field of Classification Search
  CPC .. G02F 1/133516; H01L 27/322; H01L 51/56
  USPC .................................................. 359/891
  See application file for complete search history.

(56) References Cited

U.S. PATENT DOCUMENTS

| | | |
|---|---|---|
| 6,589,708 B1 | 7/2003 | Katano et al. |
| 6,761,788 B2 | 7/2004 | DeYoung |
| 6,846,728 B2 | 1/2005 | Goto et al. |
| 6,921,614 B2 | 7/2005 | Andrews et al. |
| 7,015,506 B2 | 3/2006 | Tokuda et al. |
| 7,079,251 B2 | 7/2006 | Millerd et al. |
| 7,193,625 B2 * | 3/2007 | Danner ............... G02F 1/167 345/214 |
| 7,229,726 B2 | 6/2007 | Caspar |
| 7,323,732 B2 | 1/2008 | Ho et al. |
| 7,332,257 B2 | 2/2008 | Miyako et al. |
| 7,347,530 B2 * | 3/2008 | Miller ............... G02B 5/201 347/15 |
| 7,361,437 B2 | 4/2008 | Weed et al. |
| 7,534,543 B2 | 5/2009 | Kreilich et al. |
| 7,592,563 B2 | 9/2009 | Wissenbach et al. |
| 7,595,137 B2 | 9/2009 | Denda et al. |
| 7,713,676 B2 | 5/2010 | Tsukamoto et al. |
| 7,843,604 B2 | 11/2010 | Higashiyama et al. |
| 8,199,175 B2 | 6/2012 | Sirton |
| 8,330,782 B2 | 12/2012 | Peregrym et al. |
| 8,330,783 B2 | 12/2012 | Salvestro |
| 8,436,882 B2 | 5/2013 | Salvestro |
| 8,619,109 B2 | 12/2013 | Peregrym |
| 8,815,477 B2 | 8/2014 | Ikeda et al. |
| 2009/0141218 A1 | 6/2009 | Zhou et al. |
| 2011/0039023 A1 | 2/2011 | Salvestro |
| 2011/0316955 A1 | 12/2011 | Peregrym |

FOREIGN PATENT DOCUMENTS

| | | |
|---|---|---|
| WO | WO0208801 | 1/2002 |
| WO | WO2006131088 | 12/2006 |
| WO | 2008132527 | 11/2008 |
| WO | 2009051966 | 4/2009 |
| WO | WO2009040592 A2 | 4/2009 |

\* cited by examiner

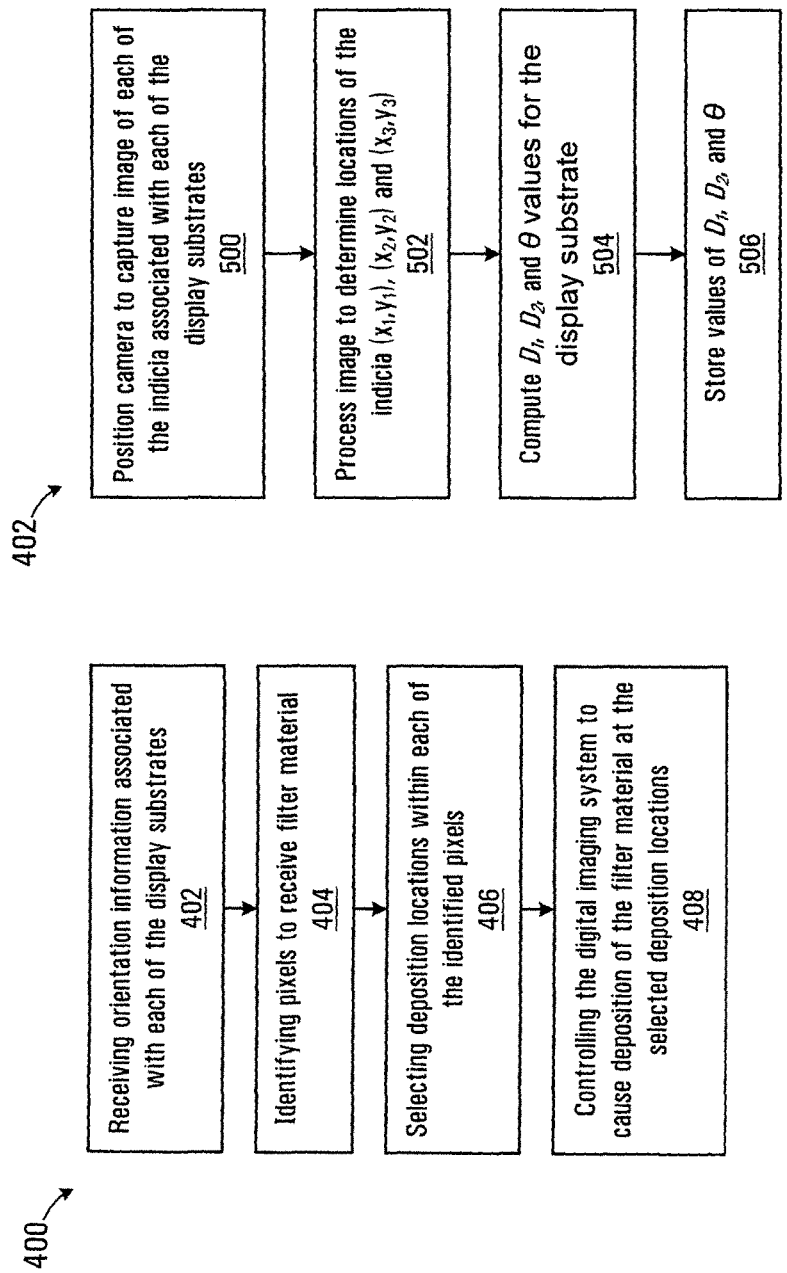

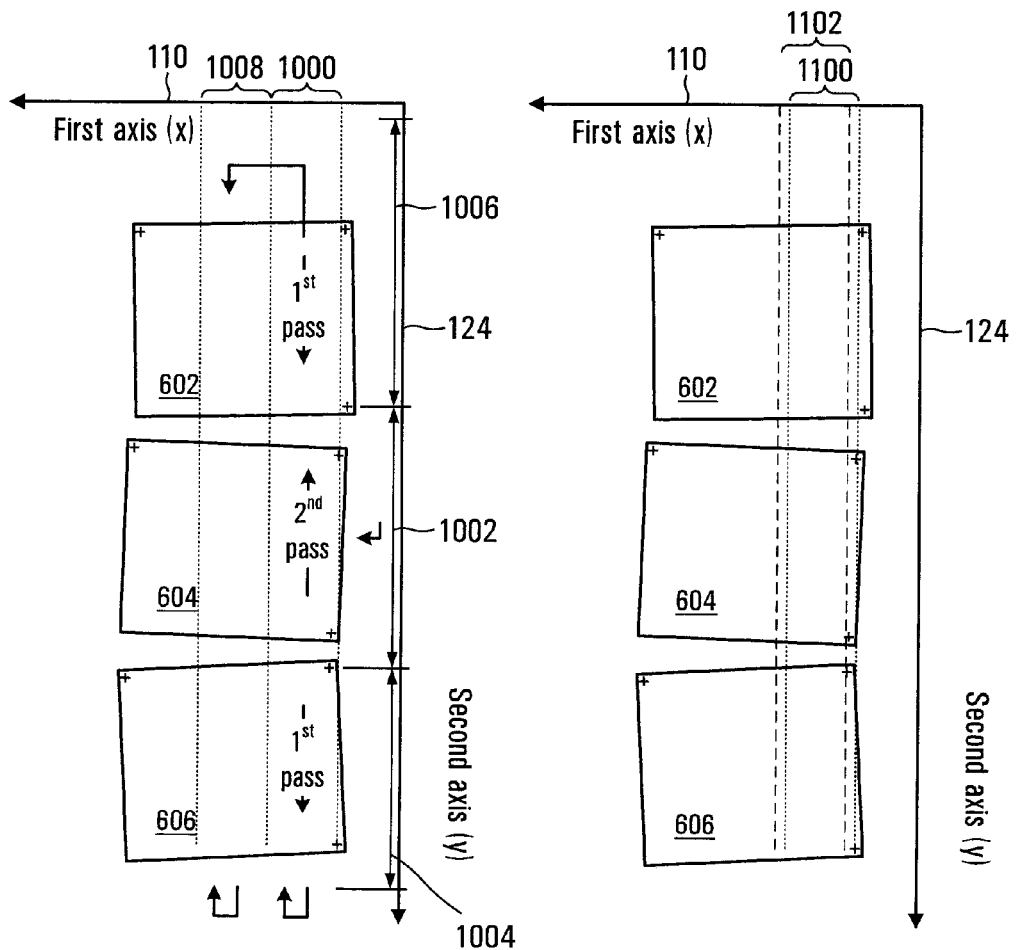
FIG. 10     FIG. 11

METHOD, APPARATUS AND SYSTEM FOR FORMING FILTER ELEMENTS ON DISPLAY SUBSTRATES

RELATED APPLICATIONS

This application is the U.S. national phase under 35 USC 371 of International Application No. PCT/CA2011/000582 filed Jul. 21, 2011, which claims the benefit of U.S. Provisional Application Ser. No. 61/400,291 filed on Jul. 26, 2010, and of U.S. Provisional Application Ser. No. 61/402,234 filed on Aug. 26, 2010, and of U.S. Provisional Application Ser. No. 61/520,138 filed on Jun. 6, 2011. All the aforementioned applications are incorporated herein by reference in their entirety.

BACKGROUND OF THE INVENTION

1. Field of Invention

This invention relates generally to electronic displays and more particularly to forming filter elements on display substrates.

2. Description of Related Art

Electronic displays are used to produce visual output for a number of electronic devices such as television and computer monitors, mobile communication devices, and electronic book devices (e-Readers), for example. Various types of electronic displays are commonly used, including liquid crystal displays (LCD), Organic Light Emitting Diode displays, Electro-wetting displays, and Electrophoretic displays, for example.

LCD displays are an example of a transmissive display that utilizes a color filter to turn what is effectively a monochromatic display into a color display. A thin film transistor (TFT) layer and a color filter layer are generally separately manufactured on glass substrates, which are subsequently aligned and assembled into a display unit. The TFT layer includes a plurality of drivers, each driver being operable to control a small area of the display or picture element (pixel). The color filter layer generally includes red, green, and blue color filter elements that overlay the display pixels and filter the white light to display a color image.

Color filters for LCD displays have been predominantly produced using photolithographic techniques, but thermal laser transfer of colorants or inkjet transfer of colorants onto a color filter glass substrate or even directly onto the TFT layer have also been attempted. By transferring colorants directly onto the TFT layer, the need for subsequent precision alignment of the color filter to the TFT layer is avoided.

Electrophoretic displays are an example of a reflective displays, in which ambient light provides illumination and display pixels are electronically controlled by an underlying TFT to selectively reflect the ambient light to form a display image. Like LCD displays, electrophoretic displays are also essentially monochrome displays. In order to provide a color display, color filter elements may be formed over the reflective display pixels. The color filter elements may cover substantially the entire area of the associated reflective display pixel, or may only cover a portion of the area.

There remains a need for improved methods and apparatus for forming color filters.

SUMMARY OF THE INVENTION

In accordance with one aspect of the invention there is provided a method for forming filter elements on at least one display substrate using a digital imaging system operable to selectively deposit filter material at a plurality of deposition locations. The method involves receiving orientation information defining a disposition of a plurality of pixels associated with the at least one display substrate, identifying pixels in the plurality of pixels that are to receive filter material for forming a filter element on the pixel, selecting deposition locations within each of the identified pixels in accordance with the orientation information to meet an alignment criterion associated with placement of the filter element within the pixel, and controlling the digital imaging system to cause deposition of the filter material at the selected deposition locations.

Each identified pixel may have associated extents within which the filter element is to be to be placed and the alignment criterion may involve a threshold value representing a permitted deviation in placement of the filter element with respect to the extents and selecting may involve selecting deposition locations to cause sequentially shifted placement of the filter element with respect to the extents in subsequent identified pixels while the sequentially shifted placement remains within the threshold value. Selecting may further involve selecting deposition locations to cause placement of the filter element to be shifted within the threshold value when the sequentially shifted placement exceeds the threshold value.

Selecting deposition locations to cause placement of the filter element to be shifted back within the threshold value may involve selecting deposition locations that are shifted with respect to the extents by at least a spacing between adjacent deposition locations.

The method may involve introducing a random variation in the threshold value, the random variation being operable to disrupt regular patterns that occur in filter element placement due to the sequentially shifted placement of the filter elements in the subsequent pixels.

Identifying the pixels may involve identifying pixels in the plurality of pixels to receive one of a plurality of colored filter materials, and selecting the deposition locations may involve selecting deposition locations to cause placement of the filter element to be varied between each of the plurality of colored filter materials to disrupt regular patterns that occur in filter element placement due to the sequentially shifted placement of the filter elements in the subsequent pixels.

The deposition locations may include first deposition locations generally aligned along a first axis of the display substrates, and second deposition locations generally aligned along a second axis of the display substrates, the second deposition locations being more closely spaced than the first deposition locations, and each identified pixel may have associated first axis extents in a direction of the first axis and associated second axis extents in a direction of the second axis, the first and second axis extents defining an area within which the filter element is to be placed, and selecting may involve selecting the first deposition locations to provide increased spacing between the filter element and the first axis extents, and selecting the second deposition locations to provide reduced spacing between the filter element and the second axis extents, such that the selection of first and second deposition locations together meets a coverage criterion associated with the filter element.

The selecting may further involve introducing a random variation in placement of the filter element, the random variation being operable to disrupt regular patterns that occur in filter element placement due to the selecting.

Introducing the random variation in placement of the filter element may involve introducing a random variation in the selecting of the first deposition locations such that the increased spacing in the first axis direction varies randomly between subsequent identified pixels, and the selecting of the second deposition locations may involve selecting second deposition locations to meet the coverage criterion associated with the filter element.

The first deposition locations may be associated with actuating ones of a plurality of individually actuable channels, the individually actuable channels being generally aligned along a first axis and operably configured to cause deposition of the filter material at selected discrete deposition locations associated with the channels.

The individually actuable channels may be provided by one of a laser radiation source operably configured to generate a plurality of individually actuable laser beams, the laser beams being selectively operable to cause deposition of filter element material from a filter material donor sheet onto the at least one display substrate, and a plurality of ink jet nozzles for depositing filter element material onto the at least one display substrate.

The second deposition locations may be associated with causing relative displacement between the display substrates and the digital imaging system in a direction generally aligned with the second axis thereby facilitating deposition of the filter material at selected deposition locations disposed in a swath extending along the second axis.

The selecting may further involve introducing a random variation in placement of the filter element, the random variation being operable to disrupt regular patterns that occur in filter element placement in the indentified pixels on each display substrate due to a spacing between adjacent deposition locations.

Identifying the pixels may involve randomly identifying pixels in the plurality of pixels to receive one of a plurality of colored filter materials to cause resulting filter elements of each color to be randomly dispersed across each display substrate.

The at least one display substrate may include at least two display substrates and the deposition locations may include first deposition locations generally aligned along a first axis of the at least two display substrates and second deposition locations generally aligned along a second axis of the at least two display substrates, and the at least two display substrates may be disposed in succession along the second axis, and receiving the orientation information may involve receiving information defining the disposition of the plurality of pixels associated with each of the at least two display substrates with respect to the first and second axes, and the method may further involve computing an offset associated with the plurality of pixels in a direction of the first axis for at least one of the at least two display substrates, determining a residual portion of the offset that cannot be compensated by the selection of the deposition locations, and controlling the digital imaging system may involve causing relative displacement between the at least two display substrates and the digital imaging system in a direction of the second axis, and causing the digital imaging system to be repositioned in a direction of the first axis relative to the at least two display substrates by the residual portion of the offset associated with the at least one display substrate to position the digital imaging system for deposition of the filter material on the at least one of the at least two display substrates.

Causing the digital imaging system to be repositioned may involve causing the digital imaging system to be repositioned while moving between the at least two display substrates.

Causing relative displacement between the at least two display substrates and the digital imaging system in the direction of the second axis may involve alternating between causing relative displacements in a first pass in a first direction aligned with the second axis and a second pass in a second direction opposite to the first direction, and controlling the digital imaging system may involve controlling the digital imaging system to cause deposition of the filter material on a first of the at least two display substrates on the first pass and a second of the at least two display substrates on the second pass and causing the digital imaging system to be repositioned may involve causing the digital imaging system to be repositioned while changing direction between the first pass and the second pass.

The at least two display substrates may include more than two display substrates disposed in succession along the second axis and controlling the digital imaging system may involve controlling the digital imaging system to cause deposition of filter material on alternate ones of the more then two display substrates on the first pass and remaining ones of the more than two display substrates on the second pass and causing the digital imaging system to be repositioned may involve further causing the digital imaging system to be repositioned while disposed between at least one of the alternate ones of the display substrates in the first pass or the remaining ones of the display substrates during the second pass.

The at least one display substrate may be separately disposed on a substrate mounting surface of the digital imaging system and receiving the orientation information may involve generating the orientation information by locating indicia on each of the display substrates.

The method may involve causing selected pixels on the at least one display substrate to be actuated to display the indicia.

The at least one display substrate may include a plurality of display substrates having at least one common substrate layer and receiving the orientation information may involve generating the orientation information by locating indicia on the at least one common substrate layer.

Locating the indicia may involve causing a camera associated with the digital imaging system to be positioned to capture image data representing a portion of the at least one display substrate bearing the indicia and the method may further involve processing the image data to determine a relative location of the indicia.

The deposition locations may include first deposition locations generally aligned along a first axis of the display substrates and second deposition locations generally aligned along a second axis of the display substrates, and controlling the digital imaging system may involve alternating between causing relative displacements in a first pass in a first direction aligned with the second axis and a second pass in a direction opposite to the first direction, and causing deposition of the filter material at a first plurality of the selected deposition locations during the first pass, and causing deposition of the filter material at a second plurality of the selected deposition locations during the second pass.

The first plurality of the selected deposition locations may include alternate selected deposition locations along the first axis and the second plurality of the selected deposition locations may include remaining selected deposition locations along the first axis.

The method may involve displacing the digital imaging system between the first pass and the second pass in a direction of the first axis.

In accordance with another aspect of the invention there is provided a computer readable medium encoded with codes for directing a controller processor circuit to carry out any of the methods above.

In accordance with another aspect of the invention there is provided a display apparatus having filter elements formed in accordance with any of the methods above.

In accordance with another aspect of the invention there is provided a digital imaging system operable to selectively deposit filter material at a plurality of deposition locations to form filter elements on at least one display substrate. The digital imaging system includes a controller operably configured to receive orientation information defining a disposition of a plurality of pixels associated with the at least one display substrate, identify pixels in the plurality of pixels that are to receive filter material for forming a filter element on the pixel, select deposition locations within each of the identified pixels in accordance with the orientation information to meet an alignment criterion associated with placement of the filter element within the pixel, and control the digital imaging system to cause deposition of the filter material at the selected deposition locations.

In accordance with another aspect of the invention there is provided a method and system for forming filter elements on at least two display substrates using a digital imaging system operable to selectively deposit filter material at a plurality of deposition locations. The deposition locations include first deposition locations generally aligned along a first axis of the display substrates and second deposition locations generally aligned along a second axis of the display substrates, the least two display substrates being disposed in succession along the second axis. The method involves receiving orientation information defining a disposition of a plurality of pixels associated with each of the display substrates with respect to the first and second axes, identifying pixels in the plurality of pixels that are to receive filter material for forming a filter element on the pixel, selecting deposition locations within each of the identified pixels in accordance with the orientation information to meet an alignment criterion associated with placement of the filter element within the pixel, and computing an offset associated with the plurality of pixels in a direction of the first axis for at least one of the display substrates. The method also involves determining a residual portion of the offset that cannot be compensated by the selection of the deposition locations, controlling the digital imaging system to cause deposition of the filter material at the selected deposition locations by causing respective relative displacements between the display substrates and the digital imaging system in a first pass in a first direction aligned with the second axis and a second pass in a second direction opposite to the first direction, and causing deposition of filter material on alternate ones of the at least two display substrates during the first pass and causing deposition of filter material on remaining ones of the at least two display substrates on the second pass. The method further involves causing the digital imaging system to be repositioned relative to the display substrates by the residual portion of the offset while disposed between at least one of the alternate ones of the display substrates in the first pass or the remaining ones of the display substrates during the second pass.

In accordance with another aspect of the invention there is provided a method and system for forming filter elements on a substrate, the substrate being subsequently aligned to a display substrate for forming a display. The method involves selecting locations to receive filter material for forming filter elements on the substrate, introducing a random variation in placement of the filter elements, and forming filter elements at the selected locations.

In accordance with another aspect of the invention there is provided a computer readable medium encoded with codes for directing a controller processor circuit to carry out the method above.

In accordance with another aspect of the invention there is provided a display apparatus having filter elements formed in accordance with the method above.

In accordance with another aspect of the invention there is provided a method for forming filter elements on a display substrate. The method involves selectively depositing filter material to form the filter elements on a plurality of pixels associated with the display substrate, and selectively exposing the deposited filter material to thermal laser radiation to condition the deposited filter material.

Selectively depositing may involve causing filter material to be transferred from a donor to the display substrate in response to receiving radiation from an imagewise controllable laser source and exposing the deposited filter material to thermal laser radiation may involve exposing the deposited filter material to radiation by the imagewise controllable laser source.

Causing filter material to be transferred from the donor to the display substrate may involve causing filter material to be transferred from the donor to the display substrate for a plurality of donors, and exposing the deposited filter material to thermal laser radiation may involve exposing the deposited filter material to thermal laser radiation on completion of transfer of material from each of the plurality of donors.

Selectively depositing filter material may involve controlling an imagewise controllable laser source to cause the deposition of filter material and exposing the deposited filter material to thermal laser radiation may involve exposing the display substrate to thermal laser radiation produced by the imagewise controllable laser source.

Selectively depositing filter material may involve controlling a first imagewise controllable laser source to cause the deposition of filter material and exposing the deposited filter material to thermal laser radiation may involve exposing the display substrate to thermal laser radiation produced by a second imagewise controllable laser source.

The method may involve changing an operating intensity associated with the laser source prior to selectively exposing the deposited filter material to thermal laser radiation.

Exposing the deposited filter material to thermal laser radiation may involve selectively exposing portions of the display substrate having deposited filter material to thermal laser radiation.

The filter elements may include color filter elements.

The color filter elements may include color filter elements on a reflective display substrate.

In accordance with another aspect of the invention there is provided a computer readable medium encoded with codes for directing a controller processor circuit to carry out any of the methods above.

In accordance with another aspect of the invention there is provided a display apparatus having filter elements formed in accordance with any of the methods above.

In accordance with another aspect of the invention there is provided a digital imaging system for forming filter elements on a display substrate. The system includes a controller operably configured to cause the digital imaging system to selectively deposit filter material to form the filter elements on a plurality of pixels associated with the display substrate, and selectively expose the deposited filter material to thermal laser radiation to condition the deposited filter material.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 4 is a process flowchart for causing the processor circuit shown in FIG. 3 to cause filter elements to be formed on the plurality of display substrates;

FIG. 5 is a process flowchart of a portion of the process shown in FIG. 4 for receiving orientation information;

FIG. 10 is a schematic view of three of the display substrates shown in FIG. 6 in accordance with an alternative embodiment of the invention;

FIG. 11 is a schematic view of three of the display substrates shown in FIG. 6 in accordance with another alternative embodiment of the invention;

DETAILED DESCRIPTION

Digital Imaging System

Figure 1:
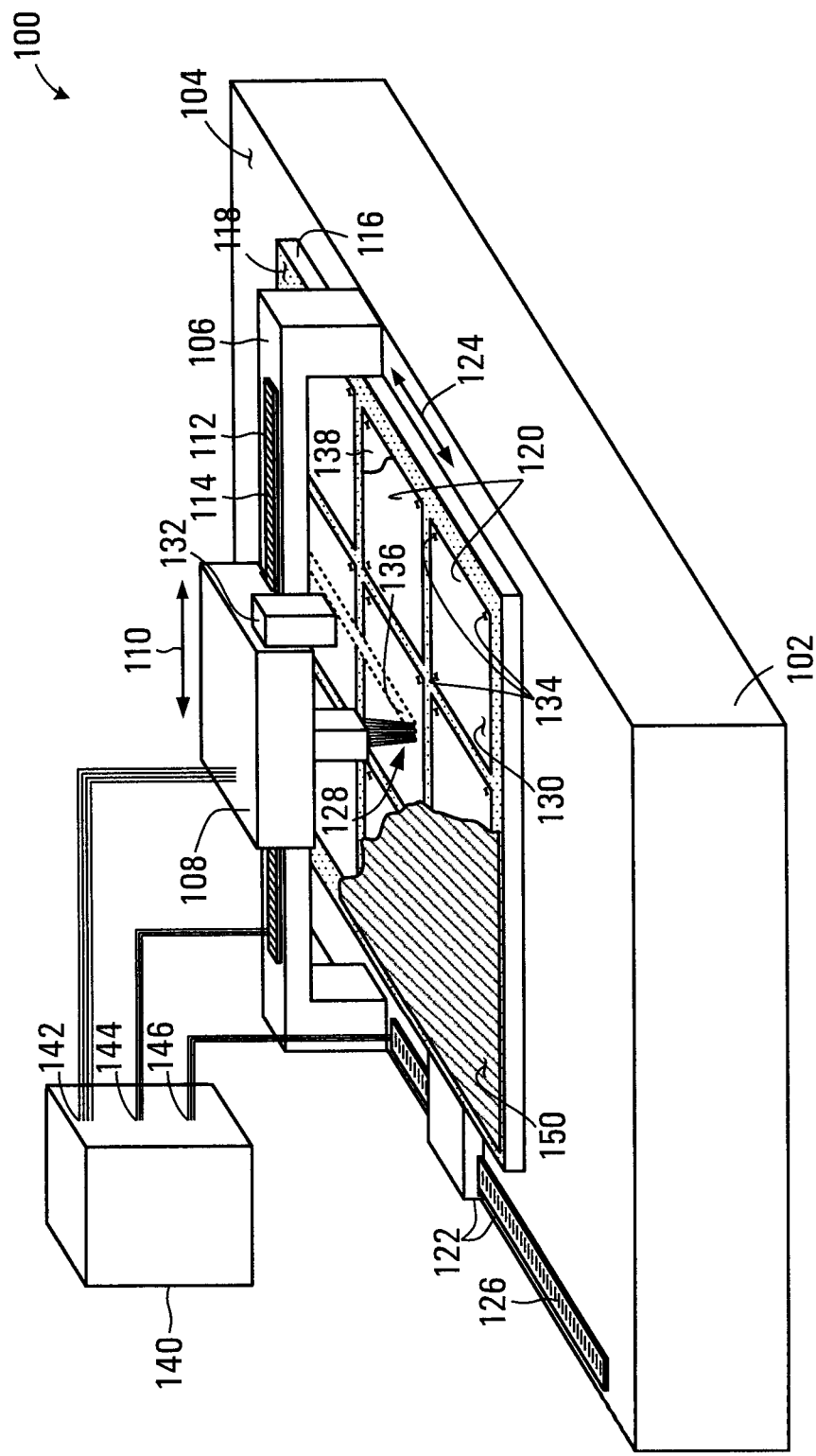
FIG. 1 is a perspective view of a digital imaging system.

Referring to FIG. 1, a digital imaging system is shown generally at 100. The system 100 is configured as a flat bed imaging system and includes a dimensionally stable base 102 having a flat upper surface 104.

The system 100 also includes a bridge 106, supported on the base 102. The bridge 106 provides a stable support for an imaging head 108, which is mounted on the bridge for motion in a first axis (indicated by the arrow 110). In the embodiment shown, the system 100 includes a first axis linear motor 112 for moving the imaging head 108 in either direction along the first axis 110. The linear motor 112 further includes encoder graduations 114 that provide positional feedback, thus facilitating precise positioning and motion control of the imaging head 108.

The system 100 also includes a mounting table or chuck 116, having a flat mounting surface 118 for mounting a plurality of display substrates 120. In this embodiment the chuck 116 includes a plurality of ports distributed over the mounting surface 118, which when coupled to a vacuum generator (not shown) draws the display substrates 120 into close contact with the flat mounting surface 118. The chuck 116 is supported on an air bearing (not shown) for reciprocating motion in a second axis (indicated by the arrow 124). In flat bed imaging systems, the second axis 124 is generally orthogonal to the first axis 110, although in some embodiments the angle between the first and second axes may be other than 90°. The system 100 further includes a second axis linear motor 122 for moving the chuck 116 in either direction along the second axis 124. The linear motor 122 also includes encoder graduations 126 that provide for positional feedback and control of the reciprocating motion in the second axis.

In one embodiment the imaging head 108 comprises a radiation source that is configured to provide a plurality of beams 128. The radiation source may be a laser, such as a laser diode and the imaging head 108 may further include a multi-channel modulator (not shown), in which individual channels are selectively actuated to generate the plurality of beams 128.

While the embodiment shown in FIG. 1 has been described as including particular components such as the linear motors 112 and 122 the system 100 could equally well be implemented using other components such as a rotating motor and ball screw mechanism or a belt drive, for example. Similarly, the chuck 116 may remain stationary and motion of the imaging head 108 may be provided by mounting the imaging head on a gantry that permits movement of the imaging head in both directions aligned with the axes 110 and 124.

In the embodiment shown in FIG. 1, each of the display substrates is separated from adjacent display substrates, and when mounted on the chuck 116 would likely have non-negligible differences in orientation, which need to be accounted for in subsequent imaging processes. In other embodiments, single or multiple display substrates 120 may be processed on a single substrate or other carrier which is loaded into the digital imaging system 100 as a single substrate. In such embodiments the registration between display substrates 120 may be significantly more precise.

Each of the display substrates 120 includes a plurality of indicia 134 disposed on an exposed outer surface 130 of the display substrate for facilitating generation of orientation information associated with the relative placement of the display substrates. The system 100 further includes a camera 132 mounted on the imaging head 108, which is configured to capture images of the indicia for generating the orientation information. Since the camera 132 is mounted to the imaging head 108 and therefore moves with the imaging head, the precise positioning of the camera is also provided by the encoder graduations 114 associated with the linear motor 112. Images of the indicia 134 captured by the camera 132 may thus be processed to determine a relative orientation of each of the display substrates 120. A relative orientation between the plurality of imaging beams 128 and the camera 132 may be determined by using one or more imaging beams 128 to produce a target feature on a test surface mounted on the chuck 116. Images of this target feature may then be captured and processed to determine a relative offset between the imaging beams 128 and the camera 132, which may be saved as a calibration value.

In the embodiment shown the display substrates 120 each include three indicia 134 that may have been marked on the display substrates in a previous processing step. Alternatively, in some embodiments where the display substrates 120 comprise reflective display pixels that are already operable, selected pixels on each display substrate may be actuated to display the indicia, thus removing the need for the display substrates to include previously marked indica. In other embodiments, the indica may comprise physical features of the display substrate, such as a portion of a TFT element associated with particular pixels, for example. In each of these indicia embodiments, the indicia on the display substrates 120 are disposed in a known fixed relation to the display pixels 200 and thus, together with a knowledge of the pixel size and configuration provides a relative location of each pixel with respect to the indicia. In general, pixels 200 of the display substrates are formed in a lithographic process which provides very precisely spaced and oriented pixels 200 and indicia 134.

In some embodiments, it may be necessary to provide for motion in a third axis that is generally orthogonal to the first and second axes 110 and 124 to account for differences in thickness between various display substrates that may be processed using the system 100. For an imaging head 108 that uses high numerical aperture imaging optics for forming the plurality of imaging beams 128, it may be necessary for the imaging head to employ an auto-focus system for maintaining focus of the beams over a full imaging area of the system 100. In such cases adjustment in the third axis may be important for ensuring that the auto-focus system is able to maintain focus.

In one embodiment filter material for forming filter elements on the plurality of display substrates 120 is provided in the form of a donor sheet 150 (a portion of which is shown in FIG. 1). The donor sheet 150 includes filter material disposed on a support layer such as a polyester film. The donor 150 may also include a release layer disposed between the filter material and support layer for enhancing transfer of filter material to the display substrates when exposed to radiation from the beams 128. For forming color filter elements, the filter material may comprise a plurality of colorants such as red, green, and blue colorants, or cyan, magenta, and yellow colorants, for example. Other colorants may also be added to the plurality of colorants. For example, a colorant such as a yellow colorant may be added to red, green and blue colorants to enhance a color gamut of the display. In such cases different donors 150 would be separately mounted and imaged to complete the color filter element deposition process. Thermal transfer donor technology is used commercially in the graphic arts industry, and several donor media such as Fuji Finalproof® and Kodak Approval™ are available for producing color proofs of digital images. A suitable donor 150 would thus include colorant material that is tailored to provide color filter elements having a desired light transmission characteristic.

While the embodiments herein are generally described with reference to deposition of color filter elements that are configured to transmit specific incident light wavelengths, the filter element may equally well interact to alter other properties of incident light. For example, the filter elements may comprise polarizing material that is deposited on selected pixels to polarize light transmitted through the filter element. Other examples of filter elements that may be deposited include interference filters or anti-glare filters.

As noted above, in the embodiment shown in FIG. 1 the imaging head 108 is a multi-channel imaging head that produces a plurality of imaging beams 128, which are directed toward the donor sheet 150 covering the exposed outer surface 130 of the display substrates 120. The donor 150 may be applied by rolling donor material into close contact with the display substrates 120 and secured in place by vacuum applied to the plurality of ports distributed over the mounting surface 118. The plurality of ports on the mounting surface 118 may be divided into substrate port regions and donor port regions that are in communication with separate vacuum circuits to permit the display substrates 120 to be secured in place while the donor 150 is applied. The donor region ports would then be activated to secure the donor in place during or after being rolled into contact with the plurality of display substrates 120.

The system 100 further includes a controller 140, which is operably configured to control operations of the digital imaging system. The controller 140 includes control signal input/output ports 142, 144, and 146 for controlling the imaging head 108, linear motor 112, and linear motor 122 respectively. Other signal outputs (not shown) may be provided for controlling the vacuum generator, donor mounting and other imaging system functions as necessary. In the embodiment shown, the signal port 142 produces signals for controlling the imaging head 108 to modulate selected ones of the plurality of imaging beams 128 in accordance with image data that is stored within the controller. The image data may be stored in the form of an image file such as a tagged image format (TIFF) file, for example.

Imaging of the thermal transfer donor may require that the imaging head 108 be configured to produce infra-red light having a wavelength and power that is sufficient to cause thermal transfer of colorant from the donor 150 onto the display substrates 120. One suitable imaging head 108 is the Thermal SQUAREspot® imaging head produced by the Eastman Kodak Company of Rochester, N.Y. While the various embodiments of the invention disclosed herein are described with reference to imaging of a thermal transfer donor, other imaging techniques for transfer of filter material such as inkjet transfer, UV transfer, laser exposure of a color resist material, or other methods may equally well be implemented to form filter elements on the display substrates 120.

In operation of the system 100, the controller 140 causes the chuck 116 to move along the second axis 124, while the imaging head 108 modulates the plurality of imaging beams 128 in accordance with the image data received from the signal port 142 of the controller 140. In one embodiment, the chuck 116 is traversed at a velocity of about 2 m/s. The resulting relative motion between the chuck 116 and imaging head 108 causes the plurality of imaging beams 128 to image a swath (shown in broken outline at 136) along the second axis having a width that corresponds in width to the number of beams 128 generated by the imaging head 108. In one embodiment the imaging head 108 generates 224 imaging beams that are spaced apart by 10.6 μm thus providing a swath width of 2.374 mm.

Once the chuck 116 has traversed the plurality of display substrates 120 in a first pass, the controller 140 causes the linear motor 122 to decelerate the chuck 116 to a stop and to reverse the traversing direction of the chuck. While the chuck 116 is being decelerated, the linear motor 112 shifts the imaging head 108 over by a swath width (i.e. by 2.374 mm in the above example) and imaging of a further swath (not shown in FIG. 1) adjacent to the swath 136 commences on the return traverse of the chuck 116 in a second pass over the substrates 120. Accordingly, in this described operational embodiment, a swath is imaged for each pass of the chuck 116. In other embodiments however, it may be desirable to image in an interleaved manner as described later herein. In such cases, the linear motor 112 may shift the imaging head 108 over by less than a swath width such that the next imaging swath at least partly overlaps the already imaged swath.

The traversal of the chuck 116 and shifting of the imaging head 108 to image successive swaths across the plurality of display substrates 120 facilitates deposition of filter material at a plurality of deposition locations. For an imaging head 108 having a plurality of imaging beams 128 that have a fixed spacing between beams, corresponding deposition locations are defined in the direction of the first axis 110 at a plurality of discrete locations. However, in the exposure head embodiment described above, the beams 128 are traversed across the display substrates 120 in the direction of the second axis 124 and accordingly deposition in this axis may occur over a greater or lesser area than provided in the direction of the first axis 110. In the example of the Kodak SQUARESpot® imaging head, the beams 128 may have a generally rectangular profile extending to approximately 10.6 μm in the first axis direction 110, and only about 1-2 μm in the second axis direction 124. In this case, the deposition locations in the second axis direction 124 may be controlled to deposit filter material with greater precision than is possible in the first axis direction 110.

In the embodiment shown in FIG. 1, the chuck 116 traverses across the upper surface 104 of the base 102 in the direction of the second axis 124, while the imaging head 108 only moves in the direction of the first axis 110. In other embodiments, the chuck may be stationary with respect to the base 102 and the bridge 106 may be disposed on a linear track for providing a traversing motion of the imaging head 108 in both the first and second axes 110 and 124.

In many cases the display substrates 120 on which filter elements are to be formed are rigid. However, even when the display being produced is to be a flexible display, it is quite common to process such a flexible display while mounted to a rigid carrier that is later removed. In other embodiments flexible display substrates may be configured so as to be suitable for mounting on a cylindrical drum surface, in which case a drum-based imager may be substituted for the flat bed imager shown in FIG. 1. The flat-bed imaging system shown in FIG. 1 may also be used to process flexible substrates.

Display Substrate

Figure 2:
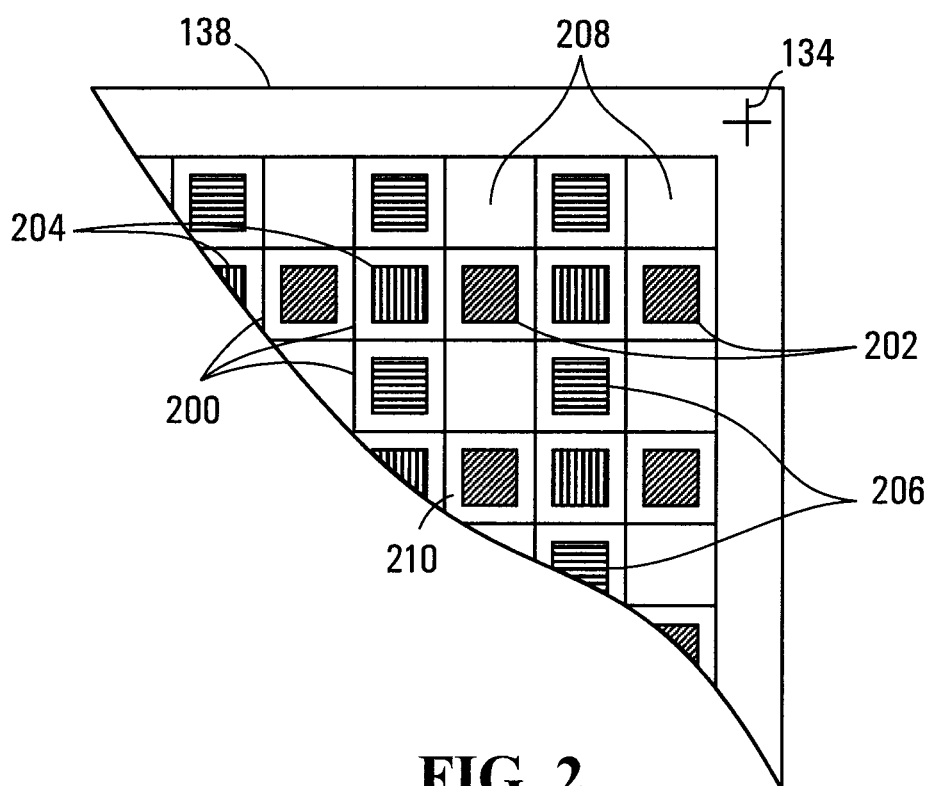
FIG. 2 is a plan view of a portion of a display substrate produced in the digital imaging system shown in FIG. 1 in accordance with a first embodiment of the invention.

A display substrate portion 138 (shown in FIG. 1) of one of the display substrates 120 is shown in greater detail in FIG. 2. Referring to FIG. 2, the display substrate portion 138 includes a plurality of pixels 200, which in this embodiment are reflective display pixels in that ambient light incident on the pixel changes state from being reflected by the pixel to being absorbed by the pixel in response to a actuation signal being provided to an underlying driver (not shown).

In the specific embodiment shown, the pixels 200 include a first plurality of pixels that have a green color filter element 202 formed on the pixel, a second plurality of pixels that have a blue color filter element 204 formed on the pixel, and a third plurality of pixels that have a red color filter element 206 formed on the pixel. A further fourth plurality of uncovered pixels 208 do not have any color filter element formed on the pixel. The color filter elements 202-206 and uncovered pixels 208 are operable to produce a reflected image, in which light reflected from the first, second and third plurality of pixels provide a color component to the resultant image, while the uncovered pixels 208 provide for a brighter display. As such, a tradeoff of such an arrangement is between a reduced color gamut and brightness of the displayed image due to the inclusion of uncovered pixels 208. In the embodiment shown, each colored filter element 202-206 covers only a portion of an area associated with the each covered pixel 200, while a portion 210 of the area remains uncovered. The uncovered areas 210 have the same function as the uncovered pixels 208, in that these uncovered areas enhance the brightness of the reflective display. The uncovered areas 210 also permit tolerances associated with placement of the filter elements 202-206 to be relaxed, since these uncovered areas reduce the possibility of filter element material deposition extending beyond extents of the associated pixels 200 into neighboring pixels. Various other arrangements of color filter elements 202-206, uncovered pixels 208, and uncovered areas 210 may be used to produce the reflective display. For example, some embodiments may omit the uncovered pixels 208 in favor of an increased uncovered area 210. Likewise, other embodiments may substantially cover the area of each pixel with filter material, and rely on uncovered pixels 208 to generate the required display brightness.

While color filters for reflective displays can be produced on a separate substrate as in the case of transmissive displays, the color filter elements may also be formed directly on the reflective display pixels using digital imaging techniques. Digital imaging of color filters involves selectively transferring colorant onto an otherwise monochromatic reflective display using a digital imaging system.

Non-reflective displays, such as LCD displays generally require that an entire light generating area of the pixel be covered by filter material, however non-light generating areas of the pixel are often covered by a black matrix material that masks these areas. In such displays that generate a luminous flux within the display itself, brightness may be increased by increasing back-illumination intensity and thus display brightness may be less of a concern than for reflective displays.

Regardless of the type of display, filter element placement should be sufficiently precise to avoid undesirable effects, such as partial coverage of a neighboring pixel by an adjacent filter element or failure to cover a sufficient area of the pixel. Lack of placement accuracy may also cause undesirable image artifacts that are visible to the eye and detract from the quality of the image produced by the resulting display. In particular, the human eye is very sensitive to repeating patterns, which may be caused by color filter element placement errors.

In one embodiment, the pixels 200 on a reflective display may have dimensions of between about 90 μm and about 220 μm, and a coverage area of the color filter material may be in the region of about 60% to about 100% of the pixel area.

When imaging multiple display substrates 120, throughput is an important consideration and it is desirable to process multiple displays as shown in FIG. 1. Simultaneous imaging of multiple display substrates 120 reduces the time overhead associated with loading and unloading of display substrates 120 and the associated donor sheets 150. Simultaneous imaging also reduces overhead associated with decelerating the chuck 116 at the end of each traverse, reversing the direction of chuck movement, and accelerating up to imaging speed again when compared to imaging of a single display substrate at a time.

In embodiments where the plurality of display substrates 120 remain connected via a common carrier or substrate layer, the offset and rotation of pixels of each of the display substrates should be substantially aligned. However, in other embodiments, such as shown in FIG. 1, each of the display substrates 120, even if initially processed as part of a larger substrate bearing multiple displays, have been separated and may thus have non-negligible differences in orientation between respective displays that complicate alignment of the imaging axis to suit pixel orientation, since pixels on one display substrate are not necessarily aligned with pixels on other display substrates.

Accordingly, it will generally not be possible to select an image start position that guarantees correct placement of filter elements 202-206 on all of the plurality of display substrates. This error may be significant depending on the relative alignment between each of the substrates and failure to account for such differences may result in significant placement errors of the filter elements with respect to the pixels of the display substrate. Furthermore the display substrates 120 may also be rotated with respect to the axes 110 and 124, which would introduce additional placement errors.

Digital Imaging System Controller

Figure 3:
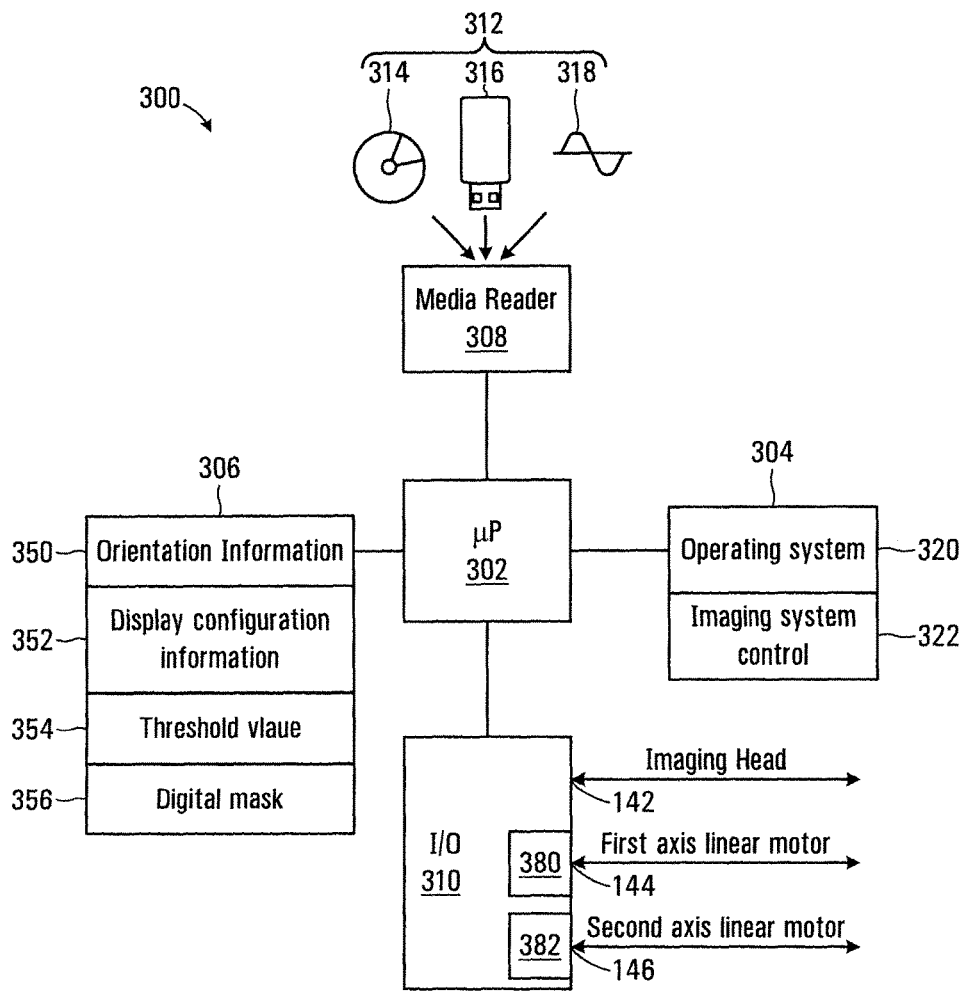
FIG. 3 is a block diagram of a processor circuit embodiment of a controller shown in FIG. 1.

Referring to FIG. 3, in one embodiment the controller 140 may be implemented using a processor circuit shown generally at 300. The processor circuit 300 includes a microprocessor 302, a program memory 304, a variable memory 306, a media reader 308, and an input output port (I/O) 310, all of which are in communication with the microprocessor 302.

Program codes for directing the microprocessor 302 to carry out various functions are stored in the program memory 304, which may be implemented as a random access memory (RAM), a hard disk drive (HDD), a non-volatile memory such as flash, or a combination thereof. The program memory includes a first block of program codes 320 for directing the microprocessor 302 to perform operating system functions and a second block of codes 322 for directing the microprocessor to control imaging functions of the digital imaging system 100 to form filter elements on the plurality of display substrates 120.

The media reader 308 facilitates loading program codes into the program memory 304 from a computer readable medium 312, such as a CD ROM disk 314, flash memory 316, or a computer readable signal 318 such as may be received over a network, for example.

The I/O 310 includes the control signal input/output port 142. The I/O 310 also includes a motor driver 380 having a control port 144 for controlling the first axis linear motor 112 and a motor driver 382 having a control port 146 for controlling the second axis linear motor 122. The I/O 310 may additionally include other outputs and/or inputs for controlling other functions of the digital imaging system 100, such as operation of the camera 132, loading of the donor 150, vacuum operations of the chuck 116, etc.

The variable memory 306 includes a plurality of storage locations including a orientation information store 350 for storing display substrate and pixel values, a display configuration store 352 for storing values associated with the pixel configuration associated with the display substrates 120, a store 354 for storing a placement threshold value, and a digital mask store 356 for storing deposition location mask values. The variable memory 306 may be implemented in random access memory, a flash memory, or a hard drive, for example.

In other embodiments (not shown), the controller 140 may be partly or fully implemented using a hardware logic circuit including discrete logic circuits and/or an application specific integrated circuit (ASIC), for example.

Forming Filter Elements

Referring to FIG. 4, a flowchart depicting blocks of code for directing the processor circuit 300 to cause filter elements to be formed on the plurality of display substrates 120 using the digital imaging system 100 is shown generally at 400. The blocks generally represent codes that may be read from the computer readable medium 312, and stored in the program memory store 322, for directing the microprocessor 302 to perform various functions related to depositing filter element material on the displays 120. The actual code to implement each block may be written in any suitable program language, such as C, C++ and/or assembly code, for example.

The process 400 begins at block 402, which directs the microprocessor 302 to receive orientation information defining a disposition of the plurality of pixels 200 associated with each of the display substrates 120.

The process then continues at block 404, which directs the microprocessor 302 to identify pixels in the plurality of pixels 200 that are to receive filter material for forming filter elements 202-206 on the identified pixels. In one embodiment, block 404 directs the microprocessor 302 to read pixel configuration information from the display configuration store 352 of the variable memory 306. In many embodiments the display substrates 120 would be identically configured and the pixel configuration (i.e. the size, number, and layout of the pixels) would that be the same. In other embodiments, different configurations of display substrates 120 may be processed at the same time and in such cases pixel configuration information would be read from the display configuration store 352 for each of the display substrates 120. The pixel configuration information read from the store 352 identifies which of the pixels (i.e. the groups of pixels in FIG. 2 on which the filter elements 202-206 are disposed) are to receive respective color filter material, and may further define the size of the filter elements and/or the uncovered areas 210. The pixel configuration information may be stored as a file including coordinates identifying the pixels, for example.

Block 406 then directs the microprocessor 302 to select deposition locations within each of the identified pixels in accordance with the orientation information received at block 402. In one embodiment the deposition locations are selected to meet an alignment criterion associated with placement of the filter elements 202-206 within the pixels 200, as described in more detail later herein. Block 408 may further direct the microprocessor 302 to save digital mask values identifying the selected deposition locations for each filter element in the digital mask store 356 of the variable memory 306. The digital mask may be stored as an image file such as a bitmap file, TIFF file, or other suitable file format.

The process 400 then continues at block 408, which directs the microprocessor 302 to read the digital mask values in the digital mask store 356 and to generate control signals at the ports 142, 144, and 146 to cause deposition of the filter material at the selected deposition locations, as described above in connection with the digital imaging system 100. The imaging head 108 responds by actuating the laser beam or beams that correspond to the selected deposition locations.

In the process embodiment 400 shown in FIG. 4, blocks 404 and 406 may be completed prior to commencing deposition of the filter element material at block 408. However in other embodiments block 408 may start before block 404 and/or 406 have completed.

Receiving Orientation Information

The process of block 402 shown in FIG. 4 for receiving orientation information is shown in greater detail at 402 in FIG. 5. Referring to FIG. 5, the process 402 is executed for each display substrate in the plurality of display substrates 120. The process begins at block 500, which directs the microprocessor 302 to generate control signals to cause the camera 132 to be positioned to capture image data representing portions of the each of the display substrates 120 bearing the indicia 134.

Figure 6:
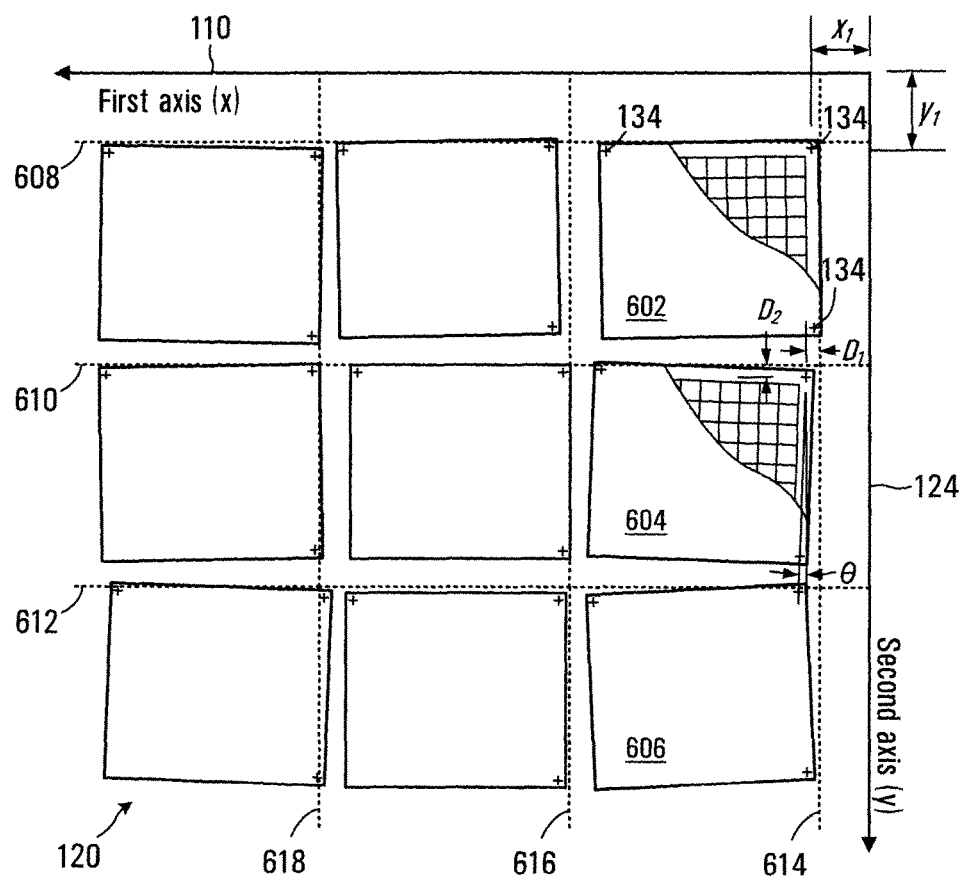
FIG. 6 is a plan schematic view of a plurality of display substrates shown in FIG. 1.

The display substrates 120 are shown in plan schematic view in FIG. 6. Referring to FIG. 6, in one embodiment nine separate display substrates are mounted for simultaneous processing in the digital imaging system 100. In general the display substrates 120 would be mounted in a frame (not shown in FIG. 1) that would orient each display approximately orthogonally with respect to the first and second axes 110 and 124 defined in the direction of the motions of the imaging head 108 and chuck 116. In FIG. 6, the frame is represented by broken lines 608-612 and 614-618, which represent a desired disposition of the plurality of display substrates 120 with respect to the axes 110 and 124.

In general, the display pixels 200 on the display substrates 120 may be formed by a lithographic process, which provides precisely spaced and oriented pixels 200. However subsequent dicing to separate the display substrates into individual display substrates 120 may result in the pixels 200 being slightly misaligned with respect to edges of the substrate. Registration to the frame, if provided, may also be imprecise when compared to dimensions of the pixels and/or the spacing between deposition locations provided by the imaging head 108. Accordingly, a second display substrate 604 of the plurality of display substrates 120 has an associated disposition with respect to the axes 110 and 124 that includes an offset $D_1$ with respect to the line 614, an offset $D_2$ with respect to the line 610, and a rotation angle θ. In FIG. 6, such misalignments have been exaggerated for sake of clarity, as have the size of the pixels 200. In practice, misalignments may be small enough to be unnoticeable to the naked eye, but large enough to cause at least some placement inaccuracy of the filter elements 202-206 if not corrected. Furthermore, in a practiced display the pixels would generally be significantly smaller and greater in number than show in FIG. 6.

The process then continues at block 502, which directs the microprocessor to process the images to determine coordinates $(x_1, y_1)$, $(x_2, y_2)$ and $(x_3, y_3)$ of each of the indicia 134 on the display. As an example, the coordinates $(x_1, y_1)$ for the first upper right hand indicia 134 for a first display substrate 602 of the plurality of display substrates 120 are shown as being referenced to the coordinate frame defined by axes 110 and 124.

Block 504 then directs the microprocessor 302 to compute values for $D_1$, $D_2$, and θ for the display substrate and block 506 directs the microprocessor to store the values in the orientation information store 350 of the variable memory 306 (shown in FIG. 3). Referring to FIG. 6, in this embodiment the value of $D_1$ is calculated as an offset from the line 614 to the first indicia on each display substrate, as shown in connection with the display substrate 604. Similarly the value of $D_2$ is calculated as an offset from the line 610 to the first indicia. In this embodiment the angle θ for each display substrate is defined as the angular deviation of a line extending between the upper and lower right hand indicia on the display substrate 604 with respect to the second axis 124. The angle θ is thus given by:

$$\theta = \arctan\left[\frac{x_2 - x_1}{y_2 - y_1}\right] \quad \text{Eqn 1}$$

where $(x_1, y_1)$, $(x_2, y_2)$ are the respective coordinates of the upper and lower right hand indicia as determined in block 502. Block 506 then directs the microprocessor 302 to store the values in the orientation information store 350 of the variable memory 306.

Selecting Deposition Locations

Figure 7:
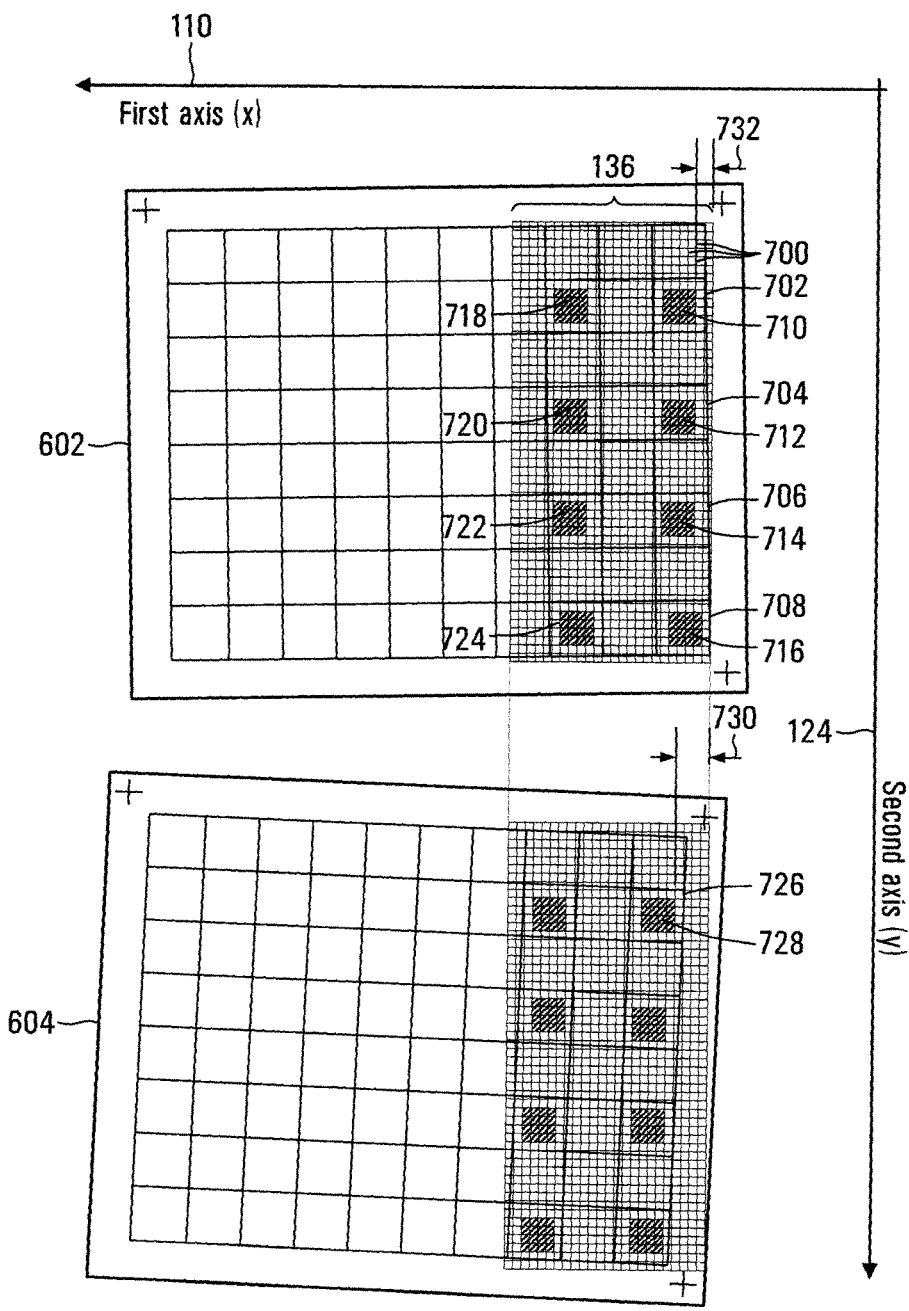
FIG. 7 is an enlarged view of two of the display substrates shown in FIG. 6.

Following execution of blocks 402 and 404 of the process 400, the information stored in the orientation information store 350 and display configuration store 352 of the variable memory 306 facilitates calculation of a disposition of the plurality of pixels 200 associated with each of the display substrates 120 with respect to the first and second axes 110 and 124. Two of the display substrates 602 and 604 are shown in enlarged view in FIG. 7. Referring to FIG. 7, the imaging swath 136 produced by the imaging head 108 is shown superimposed over the display substrates 602-604, and includes a plurality of deposition locations 700. In the depicted embodiment, the imaging head 108 is configured to produce 24 deposition locations in the direction of the second axis. The deposition locations 700 in FIG. 7 are shown as having similar width in the first axis 110 and length along the second axis 124, however in other embodiments, the first axis width and second axis length may not be the same. Since the movement of the imaging head 108 and chuck 116 define the first and second axes 110 and 124, the swath 136 is aligned with the first and second axes.

Figure 8:
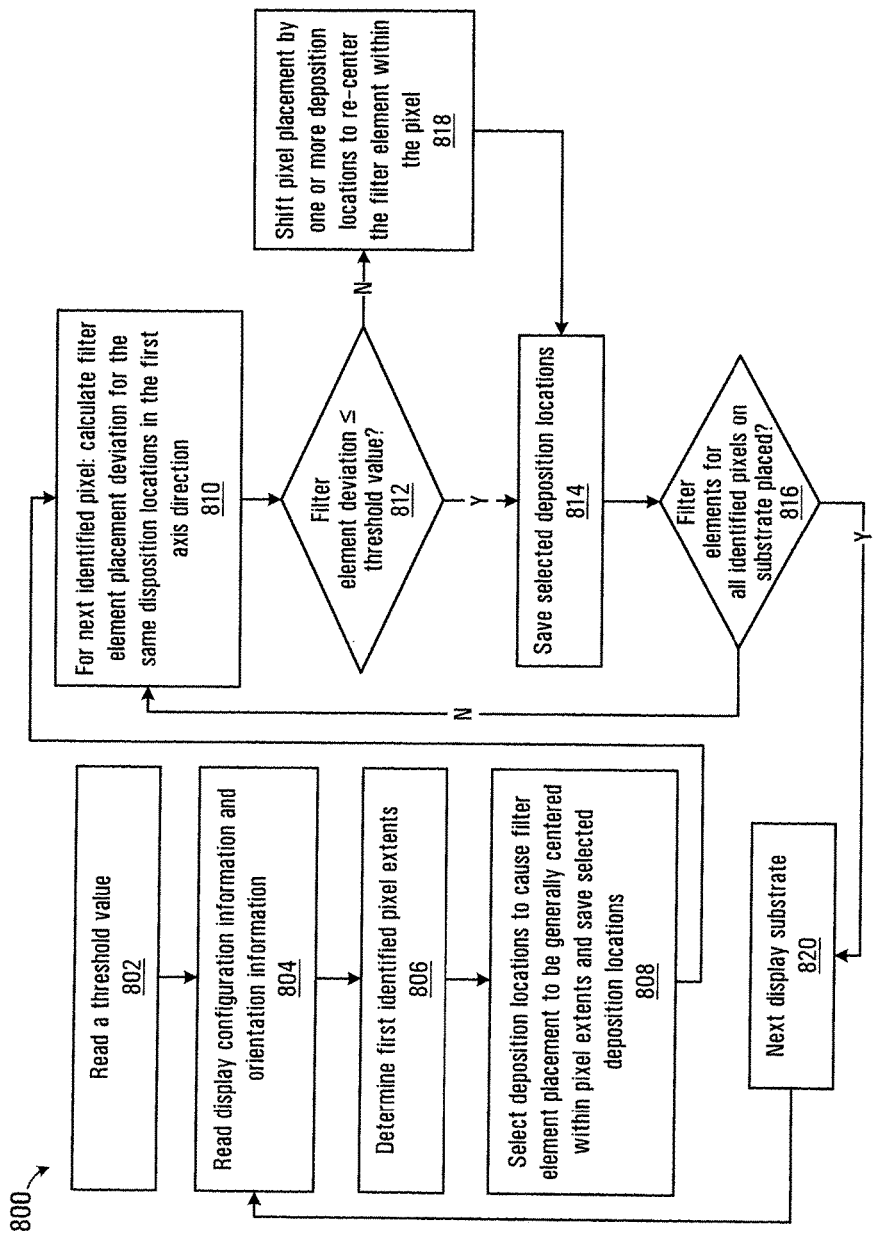
FIG. 8 is a process flowchart of a portion of the process shown in FIG. 4 for selecting deposition locations.

A first embodiment of the process of block 406 (shown in FIG. 4) for selecting deposition locations along the first axis 110 is shown at 800 in FIG. 8. Referring to FIG. 8, the process 800 begins at block 802, which directs the microprocessor 302 to read a placement threshold value from the threshold value store 354 of the variable memory 306. The placement threshold value represents a permitted deviation in placement of filter elements with respect to extents of the identified pixels 200. Block 804 then directs the microprocessor 302 to read the configuration information for the display substrate 602 from the store 352. Block 804 also directs the microprocessor 302 to read the orientation information for the display substrate 602 from the store 350.

The process 800 then continues at block 806, which directs the microprocessor 302 to use the configuration information and orientation information to determine the disposition of the extents of a first identified pixel 702 with respect to the deposition locations 700. The orientation information provides values for $D_1$, $D_2$, and θ that, together with the pixel configuration for the display substrate permit the location and extents of each pixel on the display substrate to be computed with respect to the first and second axes 110 and 124.

Block 808 then directs the microprocessor 302 to select deposition locations that would cause placement of a first filter element 710 in a generally centered location within the pixel extents. Referring back to FIG. 7, the first filter element 710 is shown to cover 16 deposition locations and is generally spaced inwardly by about one deposition location from the pixel extents along the first axis 110. Block 808 further directs the microprocessor 302 to save the selected deposition locations for the first filter element 710 in the digital mask store 356 of the variable memory 306.

The process 800 then continues at block 810, which directs the microprocessor 302 to process the next identified pixel 704 along the second axis 124 by calculating placement of the second filter element 712 for the same first axis deposition locations as the first filter element 710. In the embodiment shown, a placement deviation value with respect to the center of the extents of the second pixel 704 is calculated for the filter element 712.

Block 812 then directs the microprocessor 302 to determine whether the placement deviation of the second filter element 712 meets the alignment criterion, which in this case involves determining whether the deviation value is less than or equal to the threshold value read at block 802. If at block 812 the alignment criterion is met then the process continues at block 814, which directs the microprocessor 302 to save the selected deposition locations for the second filter element 712 in the digital mask store 356. The process then continues at block 816, which directs the microprocessor 302 to determine whether all filter elements for the substrate 602 have been placed. In this case, since further filter elements 714 and 718 are still to be placed, block 816 directs the microprocessor 302 back to block 810 and the third pixel 706 is processed in a similar manner.

In the example shown in FIG. 7, the third pixel 706 also meets the alignment criteria and digital mask values identifying the selected deposition locations are thus saved to the digital mask in the store 356. Filter element placement on the display substrate 602 for the first three filter elements 710-714 thus shifts sequentially toward the left in the direction of the first axis 110, while the alignment criterion of block 812 is met.

If at block 812 the alignment criterion is not met then the process continues at block 818, which directs the microprocessor 302 to shift the filter element placement by one of more deposition locations along the first axis 110 to generally re-center the filter element within the pixel along the first axis 110. Referring back to FIG. 7, in the example shown the alignment criteria at block 812 was not met for the fourth pixel 708, and accordingly placement of the fourth filter element 716 is shown shifted back along the first axis by one first axis deposition location. The process 800 then continues at block 818, which directs the microprocessor 302 to block 816, which directs the microprocessor to save the selected deposition locations for the fourth filter element 716 in the digital mask store 356.

In the embodiment shown in FIG. 7, the 24 deposition locations provided by the imaging head 108 permit two columns of filter elements to be simultaneously deposited and the process 800 may thus be executed to generate digital mask values for placement of additional elements 718-722 within the imaging swath 136. Similarly, the process 800 would be executed for subsequent swaths (not shown) along the first axis 110 to provide digital mask values covering all of the pixels 200 associated with the display substrate. In the example shown in FIG. 7, the filter elements 710-722 correspond to the green filter elements 202 shown in FIG. 2, and deposition locations of further filter elements 204 and 206 may be similarly selected by executing the same process 800.

If at block 816, all filter elements for the display substrate 602 have been placed, then block 816 directs the microprocessor 302 to block 820 which directs the microprocessor 302 to process the next display substrate, which in this case is the display substrate 604. Block 820 then directs the microprocessor 302 back to block 804 where display configuration information and orientation information for the next substrate 604 is read. In embodiments where all of the substrates 120 have identical configurations, the step of reading the configuration information may be omitted. Block 806 again directs the microprocessor 302 to use the configuration information and orientation information to determine the disposition of the extents of a first identified pixel 702 with respect to the deposition locations 700. As for the substrate 602, the orientation information provides values for $D_1$, $D_2$, and $\theta$ that permit the location and extents of each pixel on the display substrate to be computed with respect to the first and second axes 110 and 124. Referring to FIG. 7, a first identified pixel 726 on the display substrate 604 that is to receive deposition of a filter element 728 is further offset to the left along the first axis 110. In this case the filter element 728 is offset as indicated at 730 from the beginning of the swath 136, and this offset is greater than the offset 732 associated with the first filter element 710 on the display substrate 602. The process 800 thus takes account of the differences in relative orientation between the display substrates 602 and 604 through selection of deposition locations. Once all substrates in the plurality of display substrates 120 have been processed, the process 800 is terminated.

Due to differences in the orientation of the display substrates 602 and 604, selection of the deposition locations 700 that are to be actuated for each identified pixel 702-708 results in a successive variation of the placement of the color filter elements 710-716 within the pixels.

In one embodiment, the threshold value that is stored in the store 354 may be pre-determined based on the respective sizes of the pixels 702-708 and the desired coverage of the filter elements 710-722. For the example of a spacing between deposition locations of 10.6 μm, a pixel extent in the first axis direction of 70 μm, and a 60% coverage of the pixel by the filter element, the threshold may be set at a value of about 5 μm. Accordingly, once the deviation of the filter element from center reaches 5 μm, the filter element is moved along the axis back toward the center of the pixel by 10.6 μm. In other embodiments the spacing between deposition locations, pixel extent, and/or coverage of the pixel by the filter element may be less than or greater than the values above and the threshold may be selected accordingly. For example, in reference to FIG. 2, the threshold may be selected as a proportion of the uncovered areas 210 of the pixels 200. In one embodiment, the threshold value may be selected by assigning an initial threshold, processing one or more display substrates using the selected initial threshold, and then examining the resulting display for image artifacts or other defects. The process may then be repeated using different threshold values until a desired result is obtained.

In the embodiment shown in FIG. 7, deposition locations along the second axis 124 have the same spacing as the spacing between deposition locations along the first axis 110 and a similar process to the process 800 may thus be implemented to select deposition locations along the second axis. In other embodiments, the second axis deposition locations may be more closely spaced than the first axis deposition locations Referring back to FIG. 2, in the display substrate example shown blue color filter elements 204 are disposed adjacent to the green color filter elements 202. Execution of the process 800 may result in the filter elements 204 having the same successive shifts and thus a corresponding regular placement pattern and such a pattern may reinforce the pattern already present in the placement of the filter elements 202. Accordingly in a second embodiment, the process 800 may be implemented to cause placement of the filter elements 204 to be varied between each of the plurality of colored filter materials to disrupt reinforcement of any regular patterns that occur. Such a variation may also in some circumstances lessen the effect of the pattern associated with the color filter elements 202, since an overall pattern frequency may be increased thus reducing the ability of the user's eye to discern the resulting pattern. Such variation may be introduced by deliberately offsetting certain filter elements from the generally centered location within the pixel extents such that the successive shifts cause an offset pattern in the placement of the filter elements 204. Similar offsets may also be applied to the placement of the red color filter elements 206.

In a third embodiment of the process of block 406 shown in FIG. 4, an additional step may be added to the process 800 to introduce a random variation in the threshold value read at block 802. For some combinations of pixel size, filter element coverage, and/or deposition location spacing, the sequential shifting of filter element placement that would occur when implementing the process 800 shown in FIG. 8 would lead to regular patterns in filter element placement, to which the human eye is very sensitive as disclosed earlier herein. The random variation in threshold value would act to disrupt the regular patterns that occur in filter element placement due to the sequentially shifted placement of the filter elements and associated shifts that occur in implementing the process 800. In one embodiment the random variation may be set as a proportion of the threshold value, for example ±40% or ±2 µm for the case of a 5 µm threshold value, which would thus cause the placement threshold value to be randomly selected from a set of threshold values including 3 µm, 5 µm, and 7 µm. Such random selection from the set of threshold values may be done on the basis of a random number provided by a random number generator associated with the operating system implemented by the operating system codes in the first block of program codes 320 of the program memory 304 shown in FIG. 3.

The second and third embodiments as described above may also be applied in combination, thereby offsetting patterns for the different color filter elements 202-206 while also introducing random variations in placement of the filter elements to additionally disrupt placement patters that may occur. Alternatively, identifying the pixels to receive filter material at block 404 of the process 400 shown in FIG. 4 may involve randomly identifying pixels in the plurality of pixels 200 to receive one of the plurality of colored filter materials. In this embodiment the resulting filter elements of each color would be randomly dispersed across each display substrate, thus disrupting patterns that may occur due to filter element placement. The randomized filter element locations would need to be provided to a display driver associated with the display substrate such that correct pixels may be actuated for each of the corresponding color filter elements.

While in this embodiment random variations in placement of the filter elements is accomplished by introducing a random variation in the threshold read at block 802, in other embodiments such random placement variation may be introduced elsewhere in the process 800. For example, block 808 may direct the microprocessor 302 to introduce randomness independent of the threshold value. Other implementations and embodiments described herein may also introduce a random placement variation to disrupt regular patterns that occur in filter element placement in said indentified pixels on each display substrate.

Similarly, in embodiments where filter elements are to be formed on a glass substrate or other substrate such as plastic that is subsequently aligned to the display substrate, the color filter elements may be formed using the system 100 shown in FIG. 1, or may be formed using an alternative processes for forming filter elements, such as photolithography, for example. In a further processing step, the introduction of random variations in filter element placement described herein may be implemented to disrupt regular patterns that may occur once the filter elements formed on the glass substrate have been aligned to the display. Such patterns may occur due to mis-alignment between the filter element substrate and the underlying pixels of the display. The random variation may be operable to disrupt patterns caused from alignment shifts between the color filter elements and the display pixels when the glass color filter is placed on top of the display. Such patterns may result from aliasing between the two patterns of the display pixels and filter elements as manifested when the color filter substrate and display substrate are attached to each other. The random variation may help to reduce such patterns and relax alignment precision requirements.

Repositioning of the Digital Imaging System

In the process 800 described above, when commencing processing of the first display substrate 602, the imaging head 108 may be positioned along the first axis in accordance with the orientation information read at block 804 such that the swath 136 is aligned for deposition of filter element material on the pixels 702-708 and other pixels on the display substrate. Such alignments may be made within the precision provided by the first axis linear motor 112 and associated encoder graduations 114. In one embodiment, placement accuracy may be about ±3 µm and the encoder resolution may be less than ±1 µm. Accordingly, block 808 may include the additional step of determining and applying such an alignment. However, when processing subsequent display substrates that are not precisely aligned to the display substrate 602, such as the display substrate 604 shown in FIG. 7, the swath may not be optimally aligned to the pixels of the second substrate. While the offset 730 is able to correct for some of the difference in alignment between substrates 602 and 604, there would remain a residual offset of at least half of a spacing between adjacent deposition locations.

Figure 9:
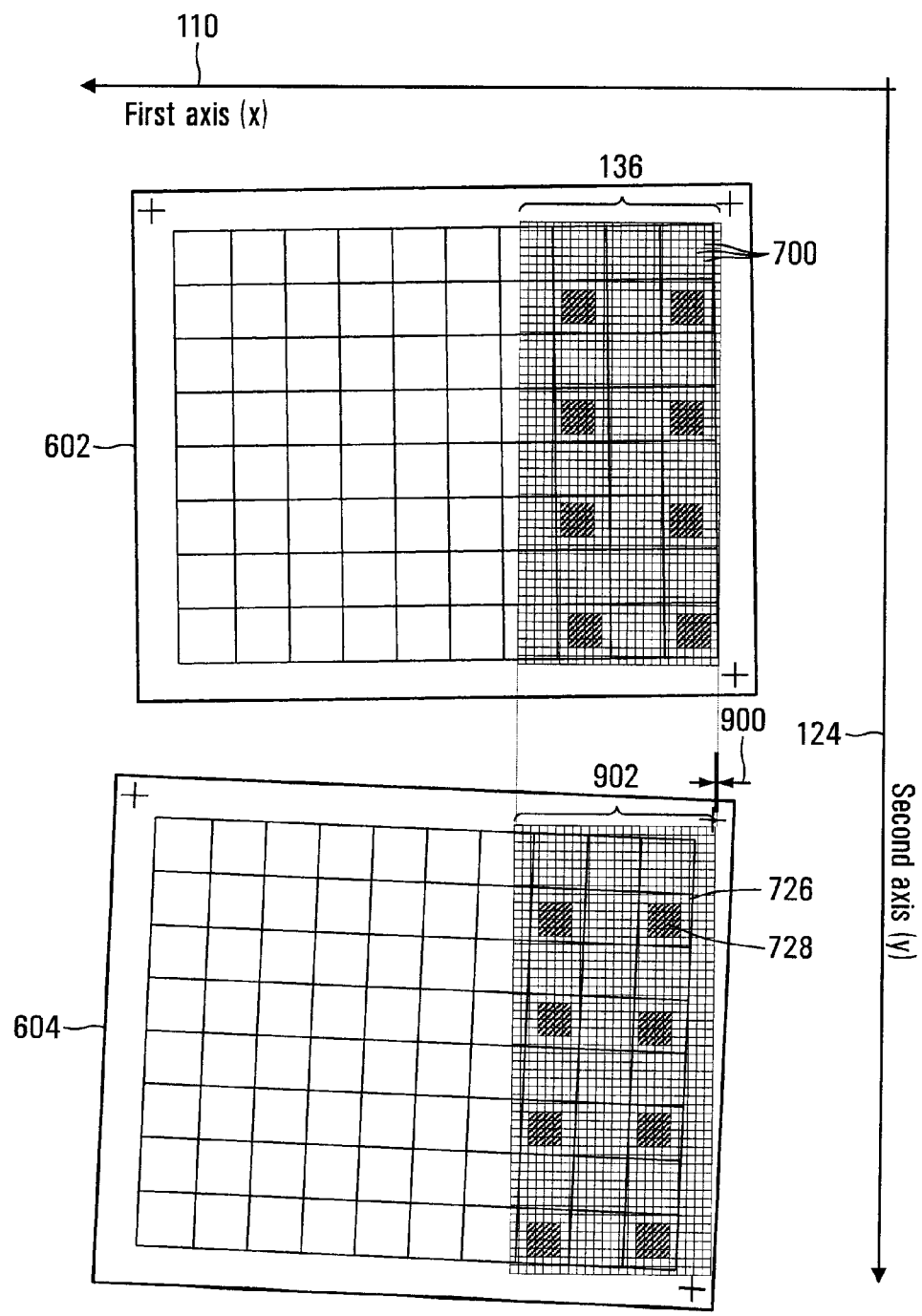
FIG. 9 is a further enlarged view of two of the display substrates shown in FIG. 6 in accordance with an alternative embodiment of the invention.

Referring to FIG. 9, in an alternative embodiment of the process 800 shown in FIG. 7, the imaging head 108 may be repositioned after deposition of the filter elements on the substrate 602 by causing a small displacement 900 in the direction of the first axis 110 that corresponds to the residual offset. During deposition of the filter elements, the exposure head 108 is displaced relative to the substrates in the direction of the second axis 124, and repositioning of the imaging head 108 to account for the residual offset that would be caused by the imaging swath 136, results in an offset imaging swath 902. The imaging swath 902 is thus offset by less than or equal to half of a spacing between adjacent deposition locations and aligns with the pixel 726 of the display substrate 604.

In order to increase filter element deposition speed in the digital imaging system 100, velocities in the second axis direction may be in the region of about 2 m/s or greater. For a 20 mm spacing between display substrates 602 and 604 the time that would be available for the displacement would be in the region of 10 milliseconds, thus requiring an acceleration of about 0.2 m/s$^2$ for a 5 µm offset in the first axis direction when taking a settling time associated with the linear motor 112 into account. This acceleration may be contrasted against the acceleration that would be required to account for the full difference between the offsets 730 and 732 shown in FIG. 7 which would be very much greater. Differences in orientation between display substrates may reach 1 mm in some cases, which under the conditions above would require an acceleration of about 40 m/s$^2$ to correct by repositioning of the imaging head 108 alone. Accordingly, the embodiment of the process shown in FIG. 9, which provides a combination of offsetting the digital mask while correcting for any residual offset by moving the imaging head to a lesser degree, would be easier to implement due to the lower required first axis acceleration.

The embodiment described above in connection with FIG. 9, has described in connection with an imaging head 108 that does not move in the first axis 110 while imaging each display substrate. However, the display substrates 602 and 604 shown in FIG. 9 each have an angular rotation with respect to the second axis 124, which causes successive shifts in the placement of the color filter elements within the pixels as described earlier in connection with the process 800. In another embodiment, the repositioning described above may be combined with a slow scan of the imaging head 108 in the direction of the first axis to also compensate for the rotation of the display substrates 602 and 604 thereby reducing the successive shifts between filter elements on subsequent pixels.

For example, a coordinated scan to match rotation angle $\theta=0.5°$ for one of the display substrates, with a 2 m/s second axis velocity of relative displacement, would require a scan velocity in the first axis direction of 0.017 m/s. The linear motor 112 and controller 140 would have about 10 milliseconds to initiate this change which would require an acceleration of about 3.4 m/s$^2$. Such an acceleration would also be reasonable for a precision flat bed imaging system, such as that shown generally in FIG. 1.

However, in other embodiments the rotation angle associated with the display substrates may be significantly higher than 0.5°, therefore requiring a larger gap between the displays in order to provide sufficient time for adapting the coordinated motion from display to display. Alternatively, if the gap between displays is constrained then higher acceleration would have to be provided by the first axis linear motor 112, which may increase cost and complexity of the first axis linear drive.

In general, the relative displacement between the display substrates and the digital imaging system in the direction of the second axis would include a first pass in a direction aligned with the second axis 124 and a second pass or return pass in a direction opposite to the direction of the first pass. In some embodiments, the imaging head 108 is offset by a width of the swath 136 while the direction of motion is being changed to facilitate deposition of filter elements on the second pass, thereby increasing throughput. In other embodiments the filter elements deposited during the second pass may be visibly different to the filter elements deposited during the first pass, and in such cases deposition may only be enabled during the first pass. Referring to FIG. 10, in another alternative embodiment, the time provided for accelerating the imaging head 108 between displays may be increased by depositing filter elements only on selected ones of the display substrates (for example substrates 602 and 606) on the first pass along the swath 1000 and then imaging remaining display substrates (for example the substrate 604) on the second pass generally along the swath 1000. One advantage associated with this embodiment, is that a distance 1002 within which the imaging head 108 may be accelerated for repositioning, as described above in connection with the FIG. 9 embodiment, is significantly increased. This reduces the associated acceleration requirements and provides more time for settling and initiation of a scan velocity in the first axis direction. In the embodiment shown in FIG. 10, the imaging head 108 is initially positioned to deposit filter elements on display substrate 602 in the first pass of the swath 1000, and is then repositioned during the time taken to traverse the distance 1002, as generally described above in connection with the embodiment of FIG. 9. Deposition of filter elements then occurs on the substrate 606, and when completed, the motion of the image head in the first pass direction is decelerated and the imaging head is accelerated up to imaging speed in the second pass direction. Accordingly, a distance 1004 is available during which the imaging head 108 may be accelerated up to imaging speed in the second axis 124, and accelerated in the first axis 110 to permit repositioning for imaging the display substrate 604 during the second pass. For typical display substrate sizes and disposition on the chuck 116, this embodiment further reduces the acceleration required in the first axis 110 over the FIG. 9 embodiment.

Once deposition of the filter elements on the display substrate 604 is completed along the swath 1000, the distance 1006 is then available for moving the imaging head 108 into position for the next swath 1008. Deposition of filter elements for the swath 1008 may proceed in the same fashion.

The embodiment shown in FIG. 10 may be used in configurations where there are at least two display substrates along the second axis 124, but is also applicable to configurations of any other number of substrates. While in FIG. 10, the embodiment has been described in connection where filter element deposition occurs on odd numbered displays during the first pass and even numbered displays during the second pass, other configurations may also be implemented where the display substrates are not regularly arranged, for example in cases where some displays are removed.

Interleaving

Referring to FIG. 11, an alternative deposition embodiment that may be combined with several of the above disclosed embodiments is shown. In this embodiment deposition for filter elements along a swath 1100 occurs on each of the display substrates 602, 604, and 606 during a first pass of the imaging head 108, but only every second deposition location is actuated on this first pass. Accordingly, incomplete filter elements would be deposited during the first pass. During the second pass, the remaining portions of the filter element are filled in by actuating the appropriate deposition locations in the second pass along the swath 1100.

Alternatively, on completion of the first pass the imaging head may be moved over by the spacing between deposition locations to align the imaging head with a second swath 1102 and during the second pass, the remaining portions of the filter element would be filled in by actuating the appropriate deposition location in the second swath 1102.

The above interleaved deposition configurations have the advantage of causing each filter element to be deposited in two passes of the image head 108 in opposite directions, thus reducing the effect of deposition differences between the first and second passes, as described above in connection with the embodiment of FIG. 10. Additionally, some imaging systems and/or media result in imperfect transfer of colorant to the display, which may be particularly pronounced when imaging solid areas such as occur within filter elements. The above interleaved deposition may also reduce such effects.

In the above description, the interleaving is described on the basis of a single deposition location, but in other embodiments the interleaving may involve more than a single deposition location.

Filter Element Shaping

The above embodiments have generally been described in connection with an imaging system that is configured to generate deposition locations that have similar dimensions in the first and second axis. However, as noted above in connection with the example of the Kodak SQUAREspot® imaging head, the generated beams 128 have a generally rectangular profile of and may be controlled to deposit filter material in the second axial direction with greater precision than is possible in the first axial direction.

Figure 12:
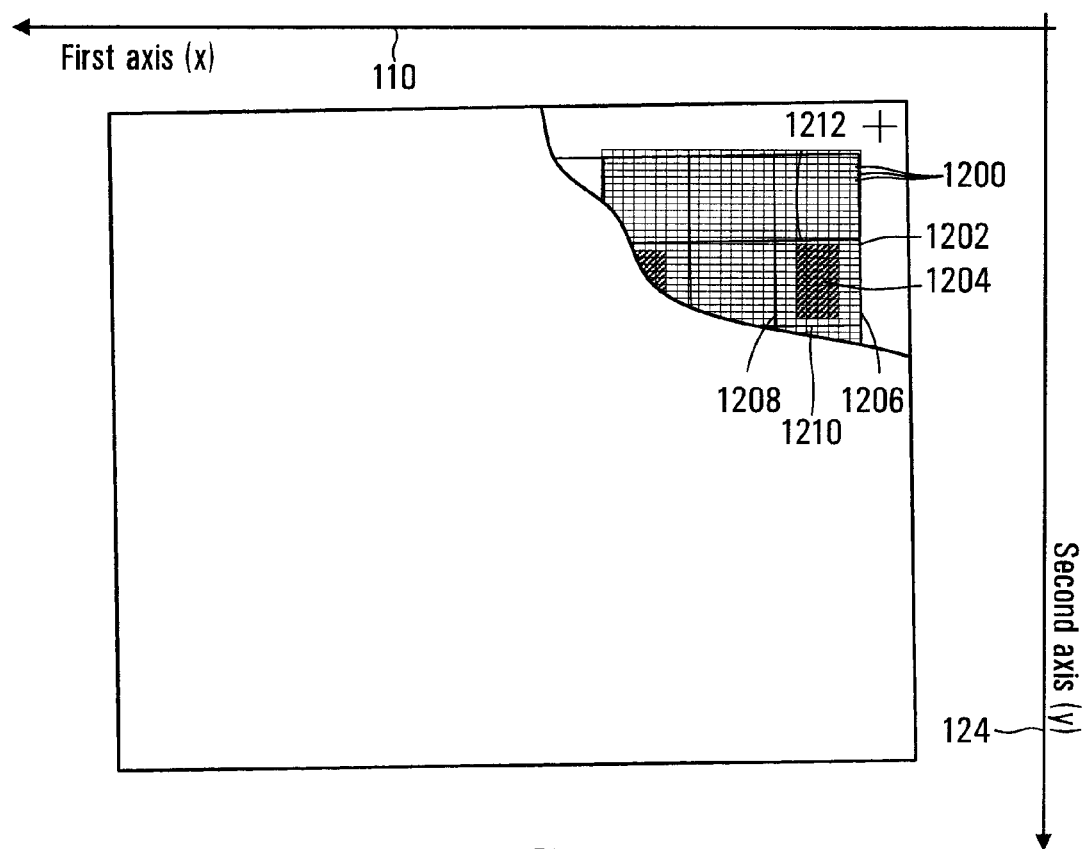
FIG. 12 is a schematic view of one of the display substrates shown in FIG. 6 in accordance with yet another alternative embodiment of the invention.

Referring to FIG. 12, in an alternative embodiment the imaging head 108 is configured to provide second deposition locations 1200 along the second axis 124 that are more closely spaced than the first deposition locations along the first axis. An identified pixel 1202 has associated first axis extents and second axis extents in the direction of the respective first and second axes as shown in FIG. 12. Under these conditions, placement of the filter element along the second axis 124 may be more precisely controlled than the placement of the filter along the first axis 110. In this embodiment, block 808 of the process 800 shown in FIG. 8, may be implemented to cause selection of deposition locations differently in the first and second axes 110 and 124. In one embodiment, the first axis deposition locations are selected to provide an increased spacing between the filter element 1204 and first axis extents 1206 and 1208 of the pixel 1202. In the embodiment shown in FIG. 12, more than a single deposition location remains unselected in the pixel 1202, which may be contrasted with the embodiment shown in FIG. 7 where in most cases only a single deposition location remained unselected in proximity to the pixel extents. However, in most embodiments the deposited filter elements should meet a coverage criterion, such as a target coverage area, to cause each pixel to have substantially similar brightness to other pixels of the same color. Accordingly, in compensation for the increased spacing in the first axis direction 110, second deposition locations along the second axis 124 are selected to provide a reduced spacing between the filter element and the second axis extents 1210 and 1212, such that the selection of first and second deposition locations together meets the coverage criterion associated with the filter element 1204 within the pixel 1202. This embodiment may also be combined with other described embodiments, such as the embodiments described in connection with FIGS. 9-11.

The embodiment shown in FIG. 12 also further facilitates introduction of a random variation in placement of the filter elements in the first and second axes in order to disrupt regular patterns that occur in filter element placement due to the selection of deposition locations by providing a greater spacing between the filter element 1204 and the first axis extents. Since the deposition precision in the second axis direction is increased over the first axis, more precise placement of the filter element along the second axis 124 has the effect of providing greater latitude for random variations in placement along the first axis 110.

In other embodiments, random variations may be introduced in spacing from the first axis extents 1206 and 1208 in subsequent identified pixels. Such random variations may be compensated by selecting the second deposition locations along the second axis 124 to meet the coverage criterion associated with the filter element. While in the described embodiments, a shape associated with the filter elements has generally been disclosed to be rectangular; in other embodiments the shape of the filter element may have a shape that is other than square or rectangular, or even an irregular shape.

Conditioning of Deposited Filter Elements

Filter elements that are deposited using any of the above embodiments, may result in the transferred filter element having a rough surface texture. This effect has been particularly noticeable when using thermal transfer donors, since the transfer at each deposition location from the donor may be imperfect. For some applications, the rough surface texture may be undesirable and may cause difficulties. For example, in the case of color filter elements for displays, optical effects due to rough surface texture may cause degradation in the quality of the image displayed by the display. It is believed that reflective displays are particularly affected by such optical effects.

In another embodiment of the invention, once the selective deposition of the filter element material has been completed, a further step may be introduced which involves selectively exposing the deposited filter material to thermal laser radiation to condition the deposited filter material. The deposited filter elements thus undergo an annealing process, which it is believed causes the temperature of the filter element material to be raised above a glass transition temperature of the material, thus permitting the material to at least partially re-flow to smooth the rough surface texture. Once cooled, the filter element material surface has improved smoothness due to the re-flow.

Selective conditioning using the same imagewise controllable laser source may have several advantages over a separate annealing step. Introducing a separate annealing process would add another step to the process, and would also involve additional annealing equipment. There also may be the possibility of damage to the display substrate by raising the temperature of the entire substrate sufficiently to cause annealing. These problems are both addressed by the selective conditioning described herein, since in general only the color filter element material will be raised to the annealing temperature reducing the risk of damage to the underlying pixels. Furthermore, for thermal transfer, the laser wavelengths that are suitable for enabling laser transfer, would generally be well absorbed by the filter element material and would thus be particularly effective in raising the filter element material to the annealing temperature.

Figure 13:
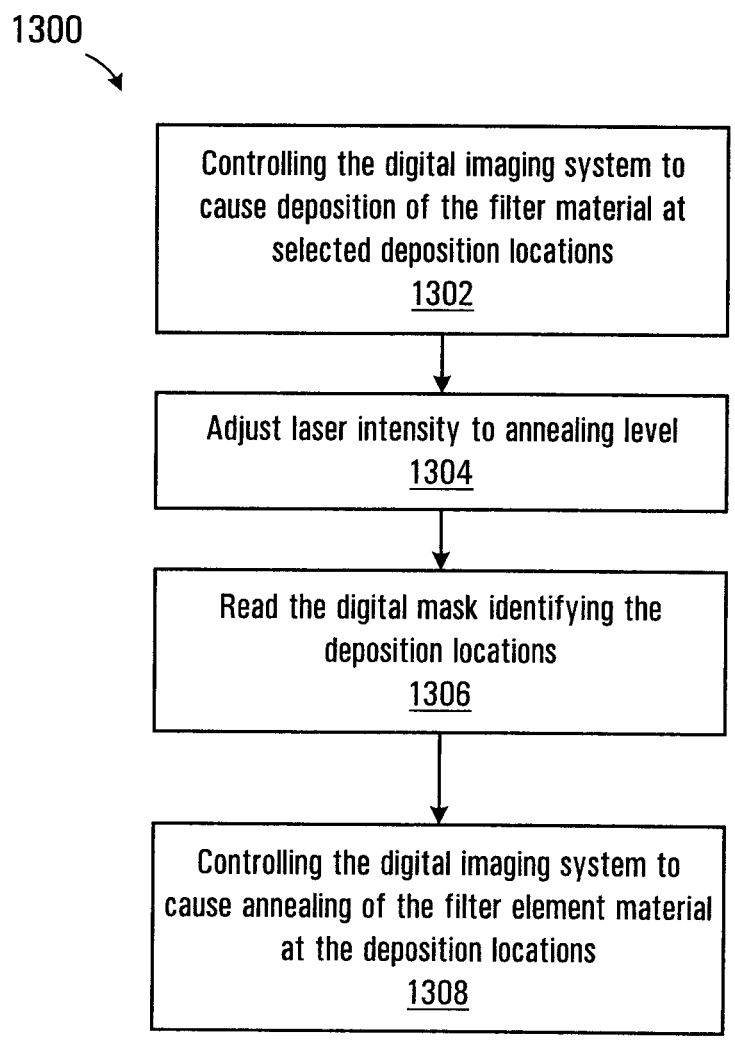
FIG. 13 is a process flowchart for causing the processor circuit shown in FIG. 3 to carry out a process for conditioning deposited filter elements.

Referring to FIG. 13, a process for directing the microprocessor 302 shown in FIG. 3 to carry out the conditioning process in accordance with one embodiment of the invention is shown generally at 1300. The process begins at block 1302, which directs the microprocessor 302 to control the digital imaging system 100 (shown in FIG. 1) to cause deposition of the filter material at selected deposition locations, as described in the embodiments disclosed above. Block 1304 then optionally directs the microprocessor 302 to adjust the intensity level of the laser source to a level suitable for annealing. Such a level may be provided by increasing or reducing the laser power or by adjusting at attenuation level associated with a modulator disposed to control radiation generated by the laser source, for example. In embodiments where the conditioning occurs at the same laser intensity or power level, block 1304 may be omitted.

The process 1300 then continues at block 1306, which directs the microprocessor 302 to read the digital mask information stored in the store 356 of variable memory 306. In embodiments where annealing of all color filter elements of different colors are to be annealed at the same time, separate digital masks associated with each of the color filter elements would additionally require processing to provide a combined digital mask for all colors. Block 1308 then directs the microprocessor 302 to generate control signals at the ports 142, 144, and 146 for controlling the digital imaging system to cause the conditioning of the filter element material, at the deposition locations.

In one embodiment, the same laser source used for deposition of the filter elements is also used to perform the selective exposure for conditioning the filter elements. In other embodiments, a different laser source having a different wavelength may be used to perform the selective exposure for conditioning the filter elements.

The above embodiments provide methods and associated apparatus for forming color filter elements either directly on pixels of a display substrate or on a glass or non-glass substrate. Direct deposition on the filter elements has one associated advantage of being performed during deposition, thus eliminating an additional alignment step. Furthermore, an additional glass layer carrying the filter element is eliminated from the resulting display product, thus reducing the weight of the display product. Direct deposition embodiments also generally result in less scattering of transmitted or reflected light, potentially providing better color display performance.

While specific embodiments of the invention have been described and illustrated, such embodiments should be considered illustrative of the invention only and not as limiting the invention as construed in accordance with the accompanying claims.

What is claimed is:

1. A method for forming filter elements on at least one display substrate using a digital imaging system operable to selectively deposit filter material at a plurality of deposition locations, the method comprising:
   receiving orientation information defining a disposition of a plurality of pixels associated with the at least one display substrate;
   identifying pixels in said plurality of pixels that are to receive filter material for forming a filter element on the pixel, each identified pixel having associated boundaries within which the filter element is to be placed;
   for each of said identified pixels, selecting deposition locations within that pixel in accordance with said orientation information to meet an alignment criterion associated with placement of the filter element within that pixel, said alignment criterion comprising a threshold value representing a permitted deviation in placement of the filter element with respect to said boundaries, said selected deposition locations causing placement of the filter element to be shifted within said threshold value when said sequentially shifted placement exceeds said threshold value, but not to be shifted while said sequentially shifted placement remains within said threshold value;
   introducing a random variation in said threshold value to achieve a random variation in placement of the filter element, said random variation being operable to disrupt regular patterns that occur in filter element placement; and
   controlling the digital imaging system to cause deposition of the filter material at said selected deposition locations in each of said identified pixels.

2. The method of claim 1 wherein selecting deposition locations to cause placement of the filter element to be shifted back within said threshold value comprises selecting deposition locations that are shifted with respect to said boundaries by at least a spacing between adjacent deposition locations.

3. The method of claim 1 wherein identifying said pixels comprises randomly identifying pixels in said plurality of pixels to receive one of a plurality of colored filter materials to cause resulting filter elements of each color to be randomly dispersed across each display substrate.

4. A display apparatus having filter elements formed in accordance with the method of claim 1.

5. A digital imaging system operable to selectively deposit filter material at a plurality of deposition locations to form filter elements on at least one display substrate, the digital imaging system comprising a controller operably configured to:
   receive orientation information defining a disposition of a plurality of pixels associated with the at least one display substrate;
   identify pixels in said plurality of pixels that are to receive filter material for forming a filter element on the pixel, each identified pixel having associated boundaries within which the filter element is to be placed;
   for each of said identified pixels, select deposition locations within that pixel in accordance with said orientation information to meet an alignment criterion associated with placement of the filter element within that pixel, said alignment criterion comprising a threshold value representing a permitted deviation in placement of the filter element with respect to said boundaries;
   introduce a random variation in said threshold value to achieve a random variation in placement of the filter element, said random variation being operable to disrupt regular patterns that occur in filter element placement; and
   control the digital imaging system to cause deposition of the filter material at said selected deposition locations in each of said identified pixels, the controller being operably configured to select deposition locations to cause placement of the filter element to be shifted within said threshold value when said sequentially shifted placement exceeds said threshold value, but not to be shifted while said sequentially shifted placement remains within said threshold value.

6. The system of claim 5 wherein the controller is operably configured to select deposition locations to cause placement of the filter element to be shifted back by selecting deposition locations that are shifted with respect to said boundaries by at least a spacing between adjacent deposition locations.

7. The system of claim 5 wherein the controller is operably configured to identify said pixels by randomly identifying pixels in said plurality of pixels to receive one of a plurality of colored filter materials to cause resulting filter elements of each color to be randomly dispersed across each display substrate.

\* \* \* \* \*